(12) United States Patent  
Tiwari et al.

(10) Patent No.: US 8,473,228 B2  
(45) Date of Patent: Jun. 25, 2013

(54) DETECTION OF ROTOR SIDE ANOMALY IN AN INDUCTION MACHINE

(75) Inventors: Arvind Kumar Tiwari, Bangalore (IN); Dragan Stankovic, Ontario (CA); Suryavalli Uppuluri, Bangalore (IN); Arijit Banerjee, Bangalore (IN)

(73) Assignee: General Electric Company, Niskayuna, NY (US)

( * ) Notice: Subject to any disclaimer, the term of this patent is extended or adjusted under 35 U.S.C. 154(b) by 630 days.

(21) Appl. No.: 12/637,027

(22) Filed: Dec. 14, 2009

(65) Prior Publication Data

US 2010/0301792 A1 Dec. 2, 2010

Related U.S. Application Data

(60) Provisional application No. 61/182,329, filed on May 29, 2009.

(51) Int. Cl.
*G01R 31/00* (2006.01)
*G01R 31/06* (2006.01)

(52) U.S. Cl.
USPC .......................................... 702/58; 324/545

(58) Field of Classification Search
USPC .................. 702/58, 57, 59–60, 64–67, 70–73, 702/75–77, 81, 84, 127, 179, 182–183, 185, 702/189–190, 193–194, 199; 324/500, 512, 324/520, 522, 525, 537, 545–546, 600, 605–606, 609; 361/23, 30–31, 33
See application file for complete search history.

(56) References Cited

U.S. PATENT DOCUMENTS

| | | | |
|---|---|---|---|
| 4,761,703 A | 8/1988 | Kliman et al. | |
| 4,808,932 A | 2/1989 | Schulz, Jr. et al. | |
| 5,030,917 A * | 7/1991 | Kliman | 324/545 |
| 5,049,815 A | 9/1991 | Kliman | |
| 5,629,870 A | 5/1997 | Farag et al. | |
| 5,742,522 A | 4/1998 | Yazici et al. | |
| 6,199,023 B1 | 3/2001 | Kliman | |
| 7,081,760 B2 | 7/2006 | Mirafzal et al. | |
| 7,099,852 B2 | 8/2006 | Unsworth et al. | |
| 7,539,549 B1 | 5/2009 | Discenzo et al. | |

OTHER PUBLICATIONS

Legowski et al., Instantaneous Power As a Medium for the Signature Analysis of Induction Motors, Jul./Aug. 1996, IEEE Transactions on Industry Applications, vol. 32, No. 4, pp. 904-909.*

"Detecting Broken Rotor Bars Prevents Catastrophic Damage", www.irispower.com, 4 pages, 2005.

(Continued)

*Primary Examiner* — Toan Le
(74) *Attorney, Agent, or Firm* — Joseph J. Christian

(57) ABSTRACT

A method for detecting an anomaly in an induction machine includes obtaining or receiving a signal from the induction machine; processing the signal so as to obtain a low frequency signal, then rectifying the low frequency signal; and, declaring if the anomaly is present, based on the rectified low frequency signal. A system for detecting anomalies is also disclosed. The present invention has been described in terms of specific embodiment(s), and it is recognized that equivalents, alternatives, and modifications, aside from those expressly stated, are possible and within the scope of the appending claims.

9 Claims, 21 Drawing Sheets

OTHER PUBLICATIONS

Elkasabgy et al., "Detection of Broken Bars in the Cage Rotor on an Induction Machine", IEEE Transactions on Industry Applications, vol. 28, No. 1, pp. 165-171, Jan./Feb. 1992.

Fiser et al., "Steady State Analysis of Induction Motor With Broken Rotor Bars", Electrical Machines and Drives, Sep. 11-13, 1995, Conference Publication No. 412@IEE, 1995, pp. 42-46.

Kliman et al., "Noninvasive Detection of Broken Rotor Bars in Operating Induction Motors", IEEE Transactions on Energy Conversion, vol. 3, No. 4, pp. 873-879, Dec. 1988.

Bellini et al., "Quantitative Evaluation of Induction Motor Broken Bars by Means of Electrical Signature Analysis", IEEE Transactions of Industry Applications, vol. 37, No. 5, pp. 1248-1255, Sep./Oct. 2001.

Ye et al., "Induction Motor Mechanical Fault Simulation and Stator Current Signature Analysis", Power System Technology, Proceedings, PowerCon2000, International Conference on vol. 2, pp. 789-794, 2000.

PCT/US2010/030739 Search Report and Written Opinion, Oct. 25, 2010.

M. Eltabach et al., "Broken Rotor Bars Detection by a New Non-Invasive Diagnostic Procedure," Mechanical Systems and signal Processing, vol. 23, No. 4, May 1, 2009, pp. 1398-1412.

S. Rajagopalan et al., "Detection of rotor Faults in Brushless DC Motors Operating Under Nonstationary Conditions," IEEE Transactions on Industr Applications, vol. 42, No. 6, Nov./Dec. 2006, pp. 1464-1477.

* cited by examiner

DETECTION OF ROTOR SIDE ANOMALY IN AN INDUCTION MACHINE

CROSS-REFERENCE TO RELATED APPLICATIONS

The present invention is a non-provisional patent application of, and claims priority to, U.S. Patent Application Ser. No. 61/182,329, filed May 29, 2009, the contents of which are hereby incorporated by reference in their entirety.

BACKGROUND OF THE INVENTION

The present invention relates generally to detecting anomalies (e.g., a broken rotor bar) in the rotor of induction machines, such as alternating current (AC) induction machines AC induction machines, or motors, are used in a wide array of applications and processes. An AC induction machine typically includes a stationary portion, a "stator," and a rotating portion, a "rotor." In a 3-phase AC machine, power is applied to the stator to induce a magnetic field, causing the rotor to turn and generate mechanical energy. The stator may include any number of "windings," or wound poles that carry the current necessary to induce the magnetic field. These windings may also be characterized by the "turns" in the windings.

An anomaly (e.g., broken rotor bar(s), failure in an end ring, etc.) in the rotor, or rotor anomaly, is one of the predominant failure modes of an AC induction machine. Rotors are typically manufactured either from aluminum alloy, copper or copper alloy or copper windings. Large machines generally have rotors and end-rings fabricated out of these materials, whereas motors with ratings less than a few hundred horsepower generally have die-cast aluminum alloy rotor cages. Some induction machines also use copper windings and slip ring and brush arrangements. Rotor anomaly rarely causes immediate failures, especially in large multi-pole (slow speed) motors. However, with a sufficiently degraded rotor, the machine may not able to develop the sufficient accelerating torque. Replacement of the rotor core in larger machine is costly and time consuming; therefore, by detecting anomaly in advance, such secondary deterioration can be prevented. Currently detection of anomalies is solved using frequency response of input current to the induction machine.

Accordingly, there is an ongoing need for improving upon accurately detecting rotor anomalies, or the onset of rotor anomalies.

BRIEF DESCRIPTION

The present invention overcomes at least some of the aforementioned drawbacks by providing an improved method and system for detecting anomalies in the rotor side of an induction machine. More specifically, the present invention is able to eliminate the need for observation of frequency components close to primary (fundamental) components of the machine. The algorithm(s) that is used herein is comparatively less intensive in computational and memory storage requirements as well.

Therefore, according to one embodiment of the present invention, a method of detecting an anomaly in a rotor of an induction machine comprises obtaining/receiving a signal from the induction machine; processing the signal thereby obtaining a low frequency signal; rectifying the low frequency signal; and, declaring if the anomaly is present, based on the rectified low frequency signal.

According to another embodiment of the present invention, a system for determining an anomaly in a rotor of a machine, comprises a device module to the machine an configured to measure characteristics of the machine, the device comprising a memory, wherein the memory comprises instructions for: obtaining/receiving a signal from the induction machine; processing the signal thereby obtaining a low frequency signal; rectifying the low frequency signal; and, declaring if the anomaly is present, based on the rectified low frequency signal.

According to another embodiment of the present invention, a method of detecting an anomaly in an induction machine, comprises calculate one of instantaneous power, positive, negative, and cross-coupled volt-ampere of the induction machine; compute an envelope of the one of instantaneous power, positive, negative, and cross-coupled volt-ampere; down-sample the envelope; calculate direct current from a signal; subtract the direct current from the signal; one of: compute a root mean square; add a top and bottom envelope signal and finding an average of an absolute magnitude of the signals; and, conduct a fft of the signal.

According to another embodiment of the present invention, a method of detecting an anomaly in an induction machine, comprises acquiring a three-phase voltage and current from the induction machine; calculating instantaneous positive sequence voltage and current; calculating instantaneous impedance; one of: calculate fft and search for low frequency component; and compute profile and compute root mean square and average computation.

According to another embodiment of the present invention, a method of detecting an anomaly in an induction machine comprises detecting at least one signal originated from the induction machine, wherein the signal signifies an anomaly; processing the signal comprising one of: removing of dc and high frequency signals from the signal; and using a peak detector to get a profile of a fault signature; and, declaring of fault of the signal.

Various other features and advantages of the present invention will be made apparent from the following detailed description and the drawings.

BRIEF DESCRIPTION OF THE DRAWINGS

The drawings illustrate one embodiment presently contemplated for carrying out the invention.

DETAILED DESCRIPTION

Aspects of the present invention have been shown to offer advantages over previous methodologies of detecting anomalies in rotors of an induction machines. The apparatus and method is based on instantaneous symmetrical components theory through which the instantaneous impedance may be computed. Instantaneous voltage sequence component may be obtained from the measured values of voltages. The instantaneous impedance when computed using voltage and current information consists of double harmonic ripple along with a low frequency ripple. This low frequency corresponds to the difference in the frequency of the currents. The algorithm(s) used in aspects of the present invention provide on line monitoring capability of an asset (e.g., induction machine) and allows the user to plan in advance the shutdown process and maintenance of the machine with a rotor side anomaly. Accordingly, this minimizes any unscheduled down time and prevent catastrophic system failure.

Figure 1:
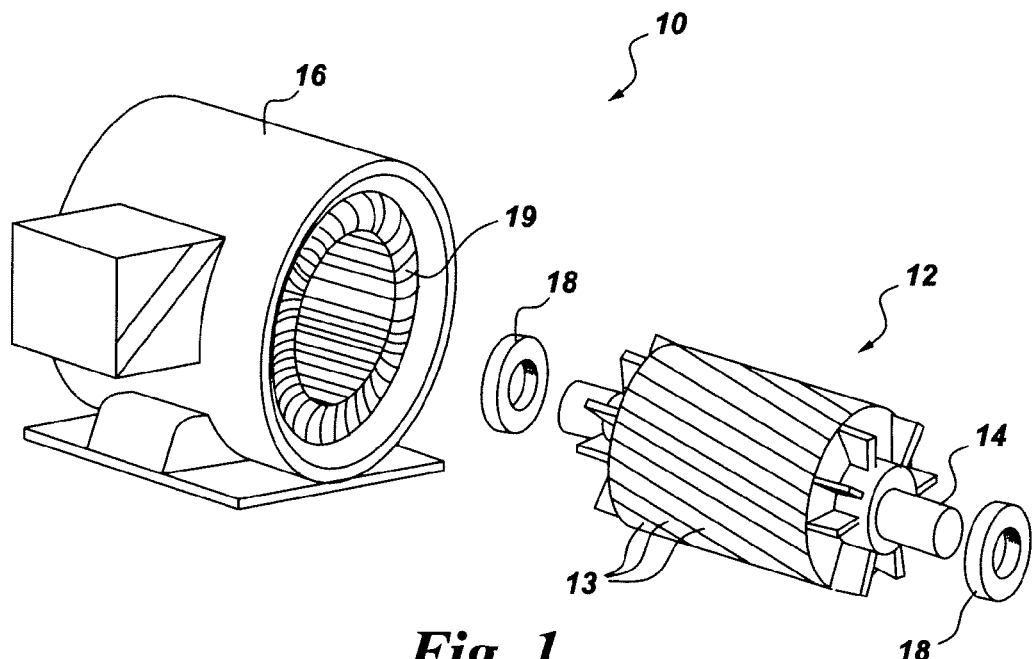
FIG. 1 is an exploded perspective view of an induction machine in accordance with an embodiment of the present invention.

FIG. 1 is a diagrammatical exploded perspective illustration of an induction machine 10. FIG. 1 is provided for illustrative purposes only, and embodiment of the present invention are not limited to any specific induction machine of configuration thereof. In the illustrated example, the machine 10 includes a rotor assembly 12, which includes a rotor shaft 14 extending through a rotor core. The rotor assembly 12 includes a plurality of rotor bars 13 extending along the outside. The rotor assembly 12 along with the shaft 14 can rotate inside the stator assembly 16 in a clockwise or a counter-clockwise direction. Bearing assemblies 18 that surround the rotor shaft 14 may facilitate such rotation within the stator assembly 16. The stator assembly 16 includes a plurality of stator windings 19 that extend circumferentially around and axially along the rotor shaft 14 through the stator assembly 16. During operation, a rotating magnetic field is produced by the currents flowing in the stator windings 19 reacts with the induced current in the rotor assembly 12 to cause the rotor assembly 12 to rotate, converting electrical energy to mechanical energy output through the shaft 14. In some embodiments, the machine 10 is a synchronous motor, and in other embodiments, the machine 10 is an asynchronous motor. Synchronous motors rotate at exactly the source frequency scaled up by the pole pair count, while asynchronous motors exhibit a slower frequency characterized by the presence of slip.

Figure 2:
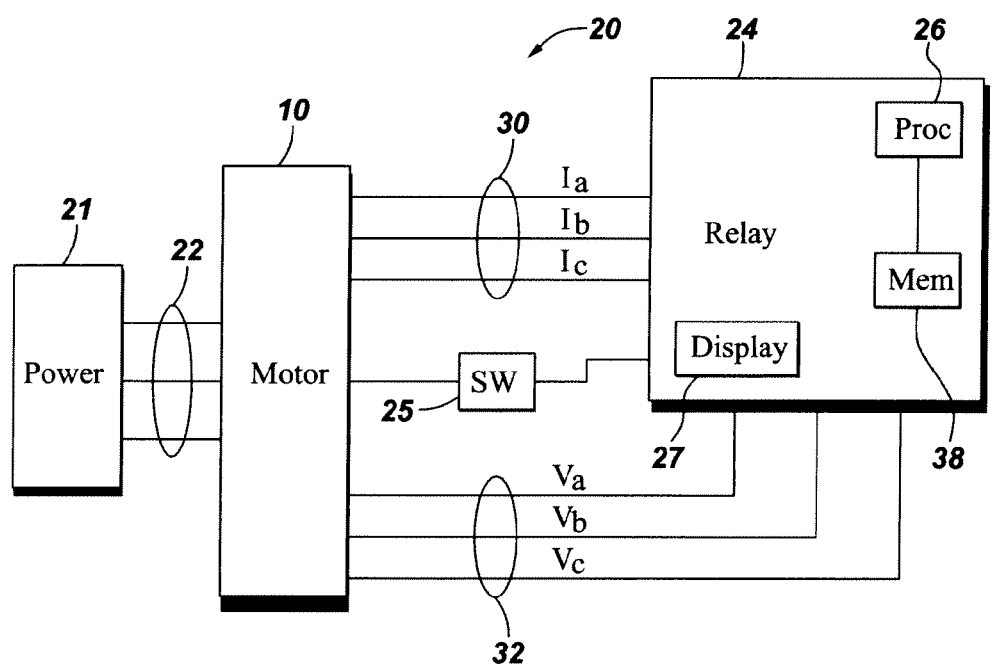
FIG. 2 is a block diagram of a system that includes the induction machine of FIG. 1 in accordance with an embodiment of the present invention.

FIG. 2 is a block diagram of a system 20 that includes the induction motor 10 of FIG. 1. The induction motor 10 may be coupled to a three-phase power source 21, such as an AC mains or other source of AC power. The three-phase AC power is delivered to the induction motor 10, as indicated by lines 22. To control and monitor the motor 10, a device 24, such as a relay, meter, or any other suitable device, may be coupled to the motor 10. It should be appreciated that the device 24 may include components of, or may be, a computer. For example, as depicted in FIG. 2, the device 24 includes a processor 26 and a memory 28. The memory 28 may be any suitable volatile memory, non-volatile memory, or combination thereof. The memory 28 may store any parameters, algorithms, or other data for controlling and monitoring the motor 10, and allow access to this data by the processor 26.

The device 24 may monitor various parameters of the induction motor 10. For example, the device 24 may be coupled to various monitoring components, such as sensors, transformers, etc., in the induction motor 10 that monitor current, voltage, or any other parameter. As indicated by lines 30, the device 24 may receive motor phase current from the motor 10. Additionally, as indicated by lines 32, the device 24 may receive motor phase voltage from the motor 10. It should be appreciated that various signal processing components may be included in the device 24 or between the motor 10 and the device 24, such as signal conditioners, amplifiers, filters, etc. The device 24 may also include a switch 25 to turn the motor on and off. As explained further below, the device 24 may shutdown the motor 10 via the switch 25 in response to a turn fault. The device 24 may also include a display 27. The display 27 may include visual and/or audio display capability.

As will be appreciated, the device 24 may also convert the received three-phase parameters to symmetrical components, e.g., positive sequence (p) components, negative sequence (n) components, and zero sequence (0) components. For example, each phasor for three-phase current Ia, Ib, and Ic may be converted to symmetrical components Ip, In, and $I_0$. Similarly, each phasor of the three-phase voltages $V_a$, $V_b$, and $V_c$ may be converted to symmetrical components $V_p$, $V_n$, and $V_0$.

This method is based on instantaneous symmetrical component theory through which the instantaneous impedance is computed. Instantaneous voltage sequence component is obtained from the measured values of voltages. The instantaneous impedance when computed using voltage and current information consists of double harmonic ripple along with a low frequency ripple. This low frequency corresponds to the difference in the frequency of the currents. This example illustrates the presence of the low frequency component in the instantaneous impedance when there is a multiple frequency. This beat frequency arising out of rotor anomaly.

The proposed method enables information related to arising anomaly in rotor side of induction machine. The proposed methods eliminate the need for observation of frequency components close to primary (fundamental) components. The proposed algorithm is comparatively less intensive in computational and memory storage requirement.

An embodiment of the invention includes an algorithm, when employed with various computer(s) and/or machines, provides an on line monitoring capability of asset (e.g., induction machine) and allows the user to plan in advance the shutdown process and maintenance of machine with rotor side anomaly. This helps minimize the unscheduled down time of the machine and prevents catastrophic system failure.

Figure 3A:
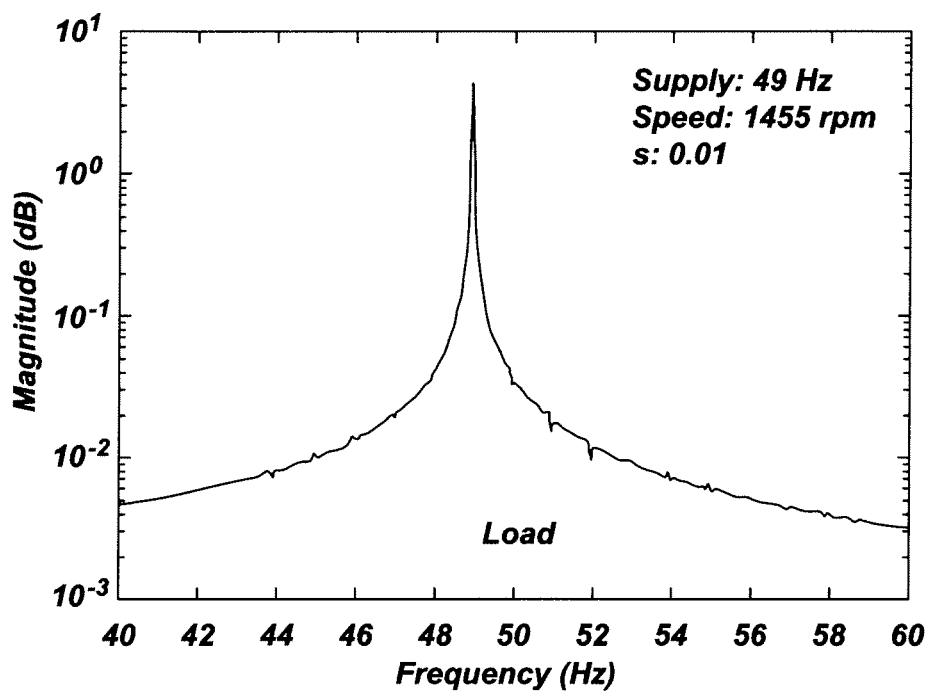
FIG. 3 shows Fourier analysis of line current with a healthy rotor (FIG. 3A) and a faulty rotor (FIG. 3B).
Figure 3B:
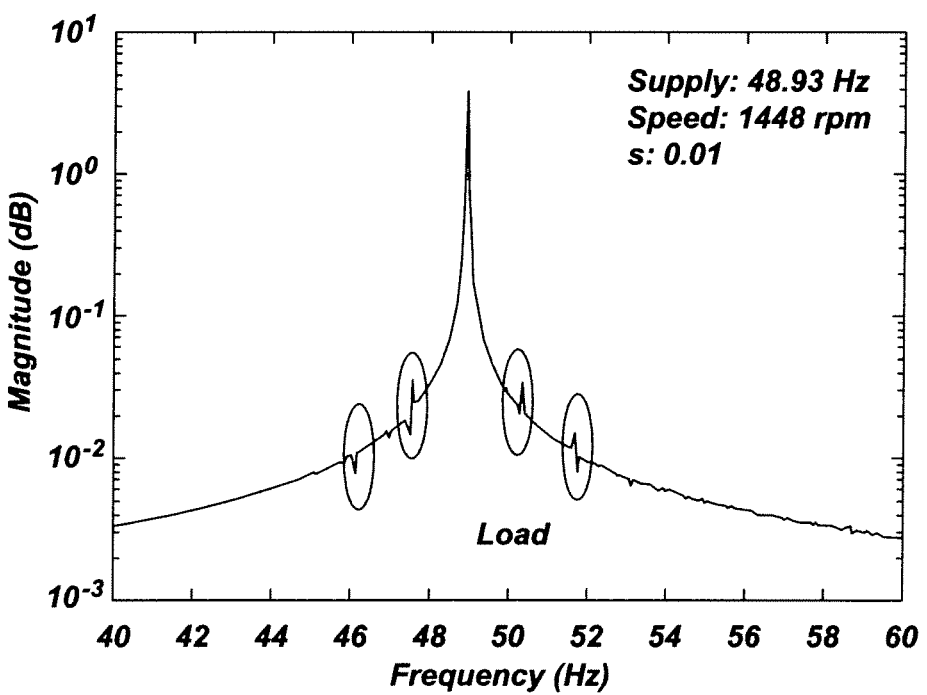

Frequency Spectrum of Line Current:

Often examination of the frequency spectrum of line current is used to determine broken rotor bar failure and bearing failure as described earlier in the literature review section. The line harmonic currents are generated are given by, anomaly in broken rotor bar. As expected this phenomenon is a slip dependent and hence the signature is not present at no load. FIG. 3 shows the comparison between the fft of line current with healthy rotor (FIG. 3A) and broken bar rotor (FIG. 3B). The magnitude of the fault frequency of current is very small. Also the frequency of interest (a function of slip) is close to the fundamental that makes it more difficult to detect till a high number of the acquired data points is obtained for a given sampling frequency in order to detect the fault. Moreover this method is computationally intensive and it generally takes into consideration only one phase.

Various Methods of Detecting Broken Rotor Bar:

In order to eliminate at least some of the aforementioned shortcomings of directly doing the Fourier analysis on line current in which the magnitude of the fault is very small, aspects of the present invention address this in its methods.

Instantaneous Impedance Method:

An aspect of the present invention includes is based on instantaneous symmetrical component theory through which the instantaneous impedance is computed. Instantaneous voltage sequence component is obtained from the measured values of voltages using equation (1)

$$\begin{bmatrix} v_p \\ v_n \\ v_o \end{bmatrix} = \frac{1}{3} \begin{bmatrix} 1 & a & a^2 \\ 1 & a^2 & a \\ 1 & 1 & 1 \end{bmatrix} \begin{bmatrix} v_a \\ v_b \\ v_c \end{bmatrix} \quad (1)$$

Similarly, instantaneous current sequence component is obtained from the measured values of currents using equation (2)

$$\begin{bmatrix} i_p \\ i_n \\ i_o \end{bmatrix} = \frac{1}{3} \begin{bmatrix} 1 & a & a^2 \\ 1 & a^2 & a \\ 1 & 1 & 1 \end{bmatrix} \begin{bmatrix} i_a \\ i_b \\ i_c \end{bmatrix} \quad \text{Where } a = 1 \angle 120° \quad (2)$$

Zero sequence component will always be real where as the negative sequence is complex conjugate of positive sequence. The instantaneous impedance is given by, $$|Z_{inst}| = \left| \frac{v_p}{i_p} \right| \quad (3)$$

For example let three voltages and three currents each of unity magnitude are considered as follows, $$V_a = \sin(\omega t) \qquad i_a = \sin(\omega t - \phi) \quad (4)$$
$$V_b = \sin\left(\omega t - \frac{2\pi}{3}\right) \quad i_b = \sin\left(\omega t - \frac{2\pi}{3} - \phi\right)$$
$$V_c = \sin\left(\omega t + \frac{2\pi}{3}\right) \quad i_c = \sin\left(\omega t + \frac{2\pi}{3} - \phi\right)$$

This is an ideal case where there are no unbalances in the machine or in the supply. The instantaneous positive symmetrical voltage and current under this condition in real-imaginary plane/Argand plane will be a perfect circle.

Figure 4:
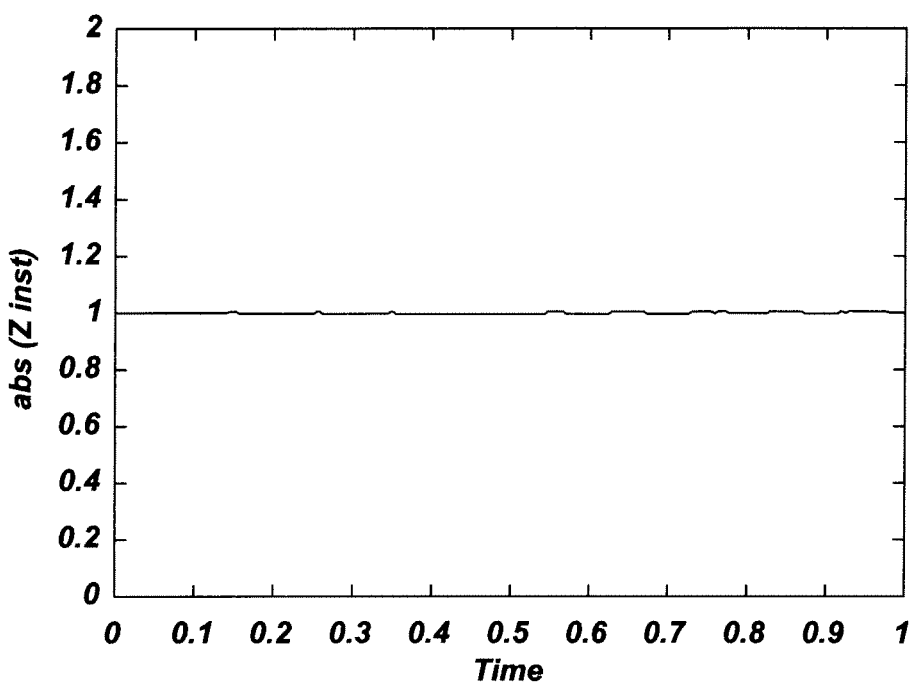
FIG. 4 shows instantaneous impedance under all balanced condition, according to aspects of the present invention.

The instantaneous impedance when computed using equation (3) under this case is as shown in FIG. 4 that is fairly constant.

Next let three voltages and three currents each of unity magnitude are considered as follows, $$V_a = \sin(\omega t) \qquad i_a = \sin(\omega t - \phi - \delta) \quad (5)$$
$$V_b = \sin\left(\omega t - \frac{2\pi}{3}\right) \quad i_b = \sin\left(\omega t - \frac{2\pi}{3} - \phi\right)$$
$$V_c = \sin\left(\omega t + \frac{2\pi}{3}\right) \qquad i_c = -(i_a + i_b)$$

Figure 5A:
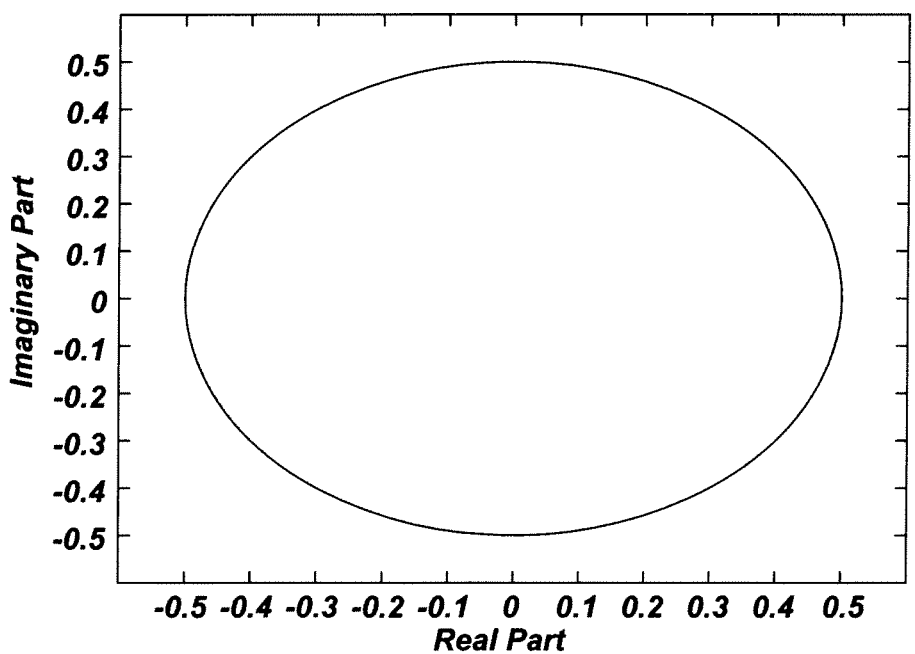
FIG. 5 shows Argand plane diagram for instantaneous positive symmetrical voltage at FIG. 5A and for instantaneous positive symmetrical current under current unbalanced condition at FIG. 5B, according to aspects of the present invention.
Figure 5B:
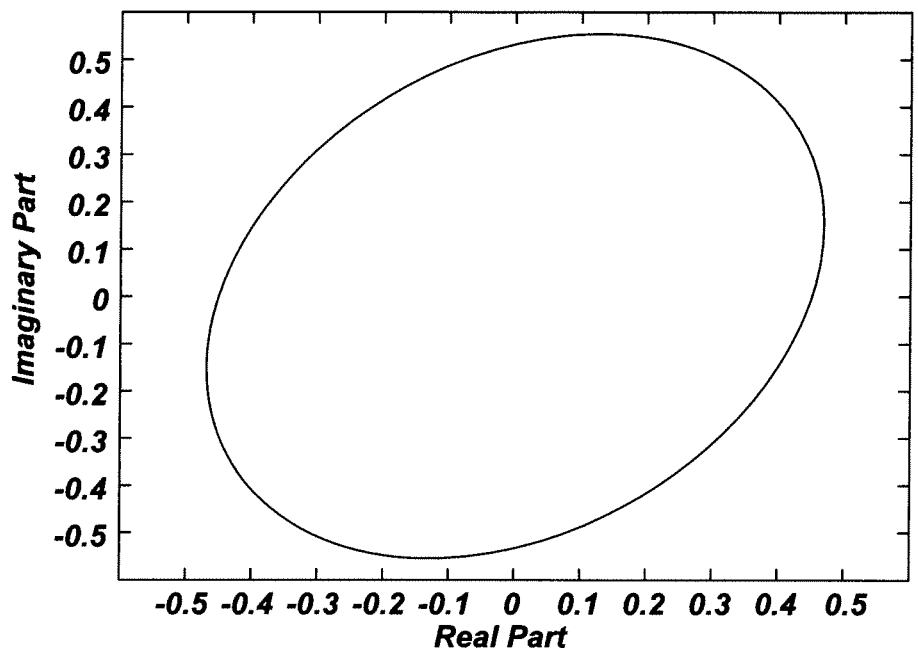

This is case where there is a deliberate unbalance created in A-phase current. FIG. 5 shows the instantaneous positive symmetrical voltage and current under this condition in Argand plane.

Figure 6:
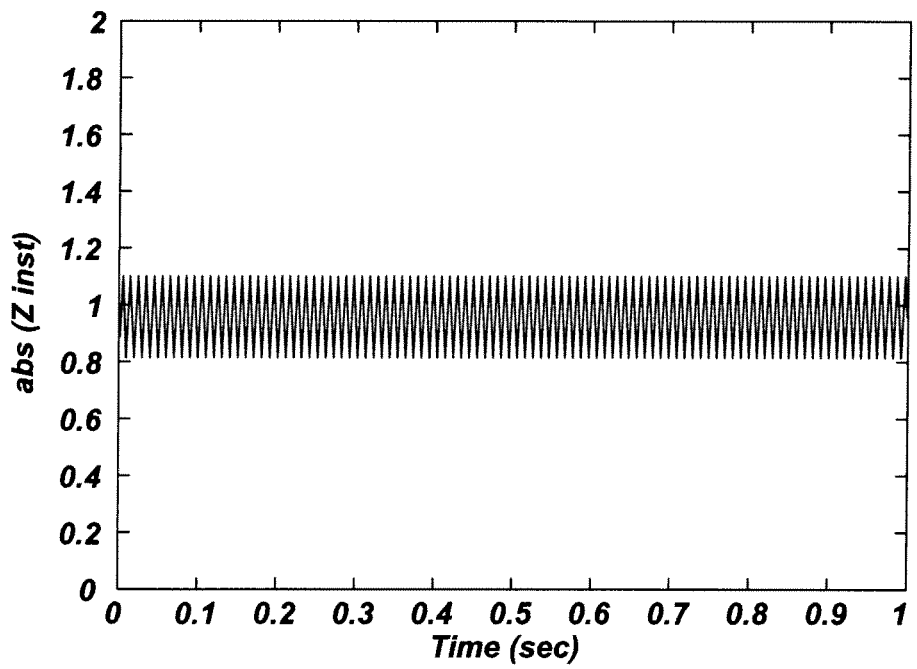
FIG. 6 shows instantaneous impedance under current unbalanced condition, according to aspects of the present invention.

The instantaneous impedance when computed using equation (3) under this case is as shown in FIG. 6 that consists of double harmonic ripple.

Next let three voltages and three currents each of unity magnitude are considered as follows, $$V_a = \sin(\omega t)$$
$$V_b = \sin\left(\omega t - \frac{2\pi}{3}\right)$$
$$V_c = \sin\left(\omega t + \frac{2\pi}{3}\right)$$

$$i_a = \sin(\omega t - \phi) + K\sin(\omega' t - \chi)$$
$$i_b = \sin\left(\omega t - \frac{2\pi}{3} - \phi\right) + K\sin\left(\omega' t - \frac{2\pi}{3} - \chi\right)$$
$$i_c = -(i_a + i_b)$$
(6)

Figure 7A:
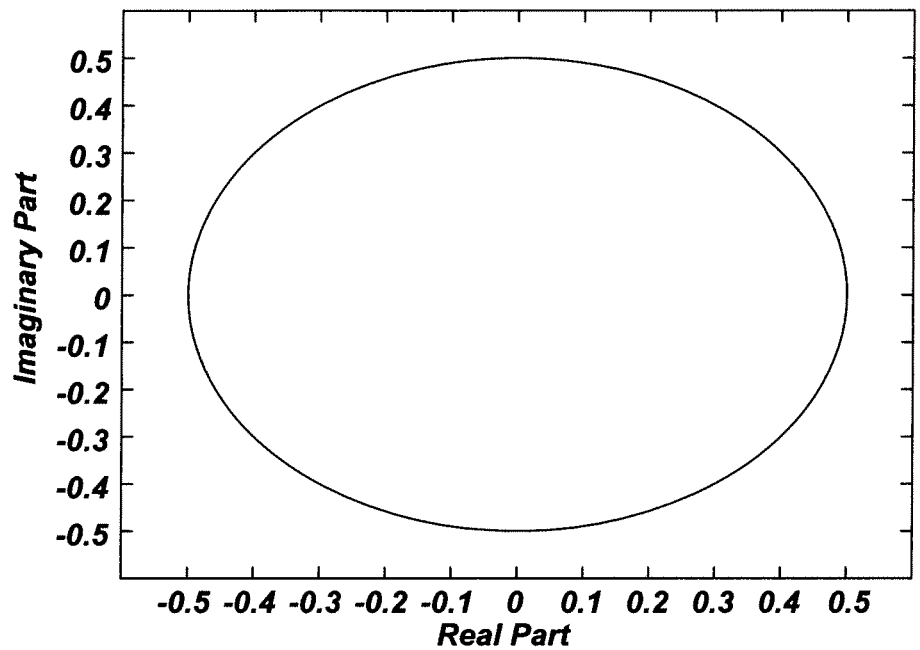
FIG. 7 shows Argand plane diagram for instantaneous positive symmetrical voltage at FIG. 7A and for instantaneous positive symmetrical current under additional frequency component at FIG. 7B, according to aspects of the present invention.
Figure 7B:
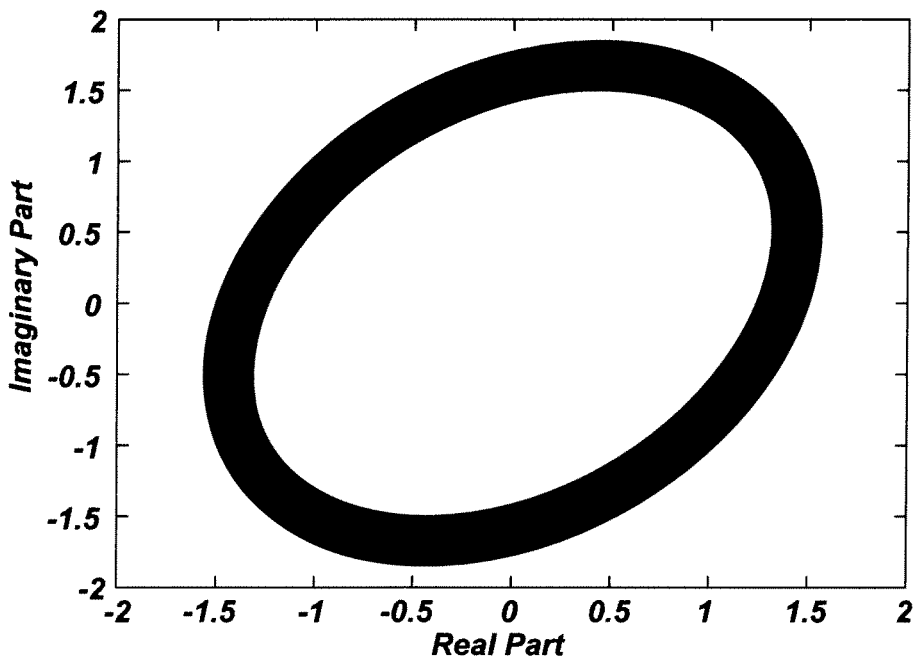

This is case where there are two additive frequency components (case similar to broken rotor bar) in currents exists. FIG. 7 shows the instantaneous positive symmetrical voltage and current under this condition in Argand plane.

Figure 8:
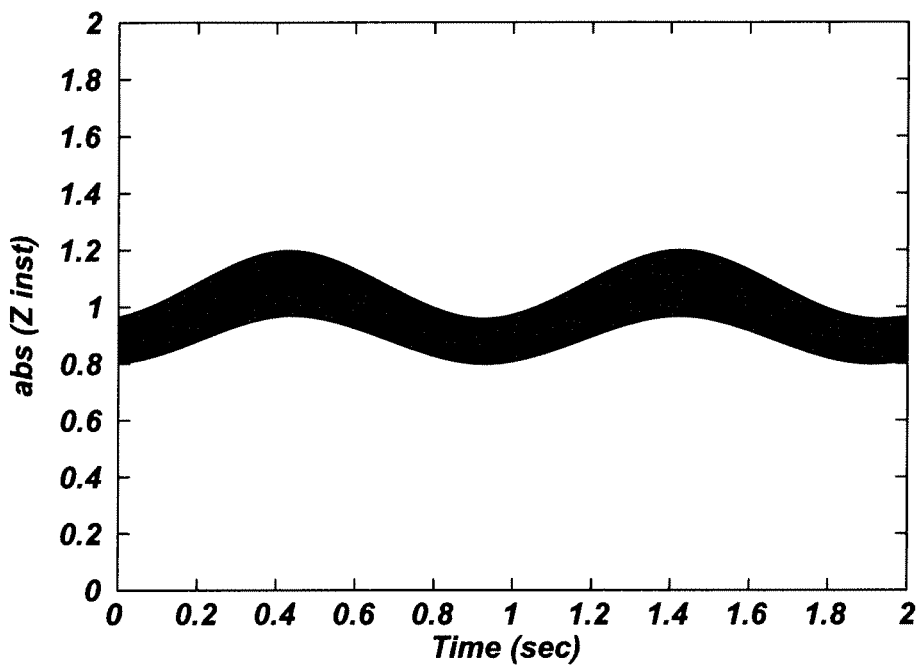
FIG. 8 shows instantaneous impedance under different frequency component in current, according to aspects of the present invention.

The instantaneous impedance when computed using equation (3) under this case is as shown in FIG. 8 that consists of double harmonic ripple along with a low frequency ripple. This low frequency corresponds to the difference in the frequency of the currents viz, (ω-ω'). This example illustrates the presence of the low frequency component in the instantaneous impedance when there is a multiple frequency.

Figure 9:
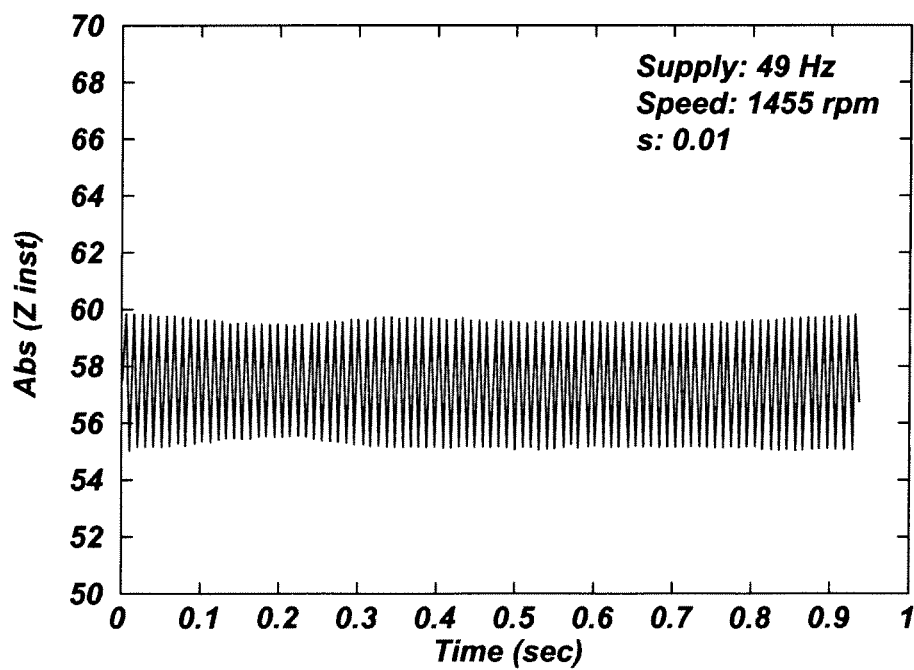
FIG. 9 shows instantaneous impedance for a healthy machine, according to aspects of the present invention.
Figure 10:
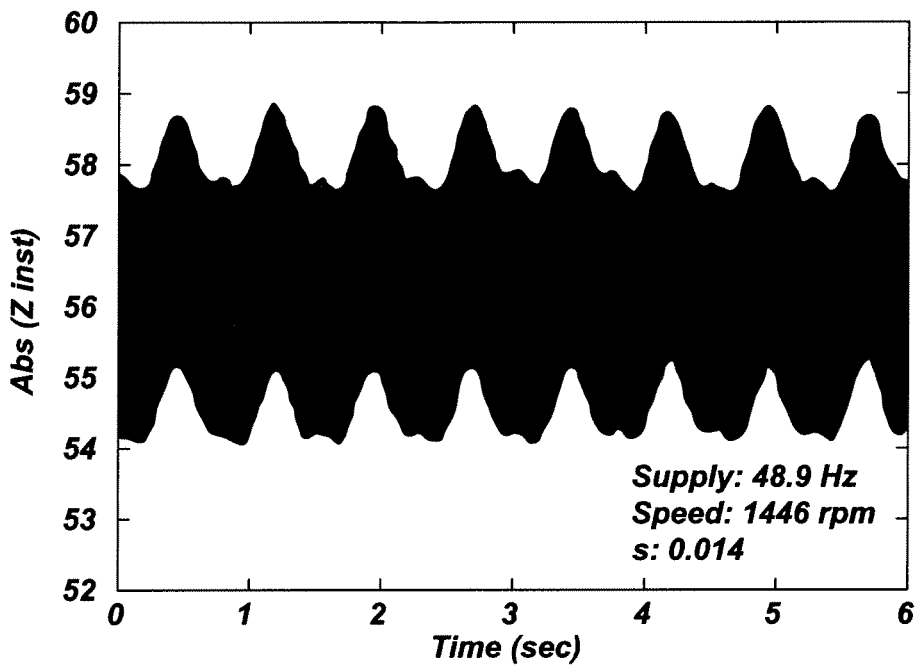
FIG. 10 shows instantaneous impedance for 1 broken bar machine, according to aspects of the present invention.

With the help of this illustration, when applied to the broken rotor bar analysis, FIG. 9 shows the instantaneous impedance for healthy machine, and FIG. 10 shows the instantaneous impedance for 1 broken bar machine.

Comparing FIGS. 9 and 10 clearly one can understand the beat frequency arising out of rotor anomaly. The main advantage with this information is that the fault signature is much more pronounced as compared to the original signature of the current. Moreover, the low frequency ripple can be much more effectively filtered as compared to the sideband frequency of the line current. Even less number of data points are required to undergo any mathematical operation on this signal to effectively detect fault.

Figure 11:
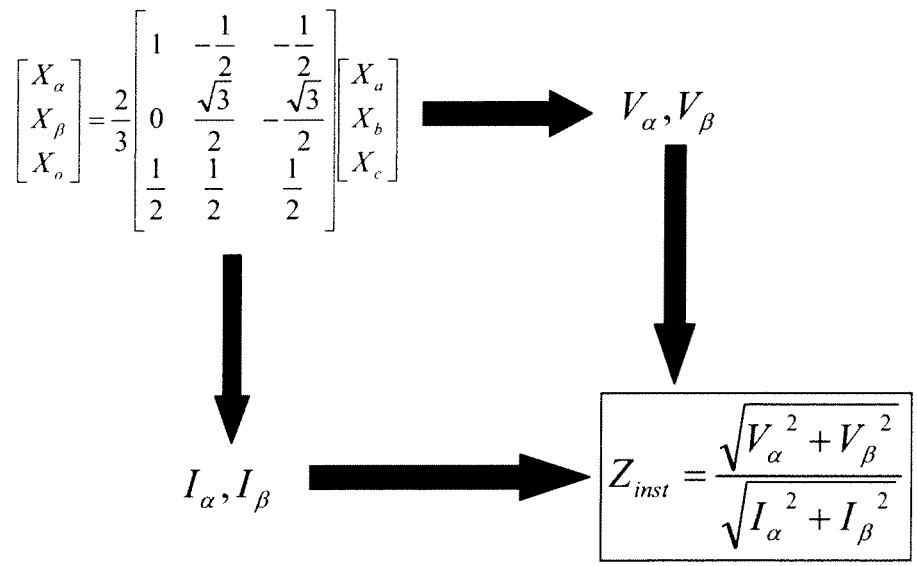
FIG. 11 shows a method of computer instantaneous impedance without complex computation, according to aspects of the present invention.

As a continuation of the above method, if it is required to reduce the computational effort of complex multiplication, one can also resort to Clarke's Transformation as illustrated in the following FIG. 11.

Volt-Ampere Method:

Another aspect of the present invention includes a volt-ampere method. In order to reduce further the computational burden of division, a multiplicative approach is taken for coherent modulation and for the pronounced effect of fault signature. Again, Clarke's transformation is utilized to compute the instantaneous alpha and beta component of the voltages and currents as shown in equation (7). Using these voltage and current components four different instantaneous volt-amperes can be computed namely, positive VA, negative VA and Cross VAs as shown using equation (8)

$$\begin{bmatrix} V_\alpha \\ V_\beta \\ V_o \end{bmatrix} = \frac{2}{3}\begin{bmatrix} 1 & -\frac{1}{2} & -\frac{1}{2} \\ 0 & \frac{\sqrt{3}}{2} & -\frac{\sqrt{3}}{2} \\ \frac{1}{2} & \frac{1}{2} & \frac{1}{2} \end{bmatrix}\begin{bmatrix} V_a \\ V_b \\ V_c \end{bmatrix}\begin{bmatrix} I_\alpha \\ I_\beta \\ I_o \end{bmatrix} = \frac{2}{3}\begin{bmatrix} 1 & -\frac{1}{2} & -\frac{1}{2} \\ 0 & \frac{\sqrt{3}}{2} & -\frac{\sqrt{3}}{2} \\ \frac{1}{2} & \frac{1}{2} & \frac{1}{2} \end{bmatrix}\begin{bmatrix} I_a \\ I_b \\ I_c \end{bmatrix}$$
(7)

$$VA_+ = V_\alpha \times I_\alpha$$
$$VA_- = V_\beta \times I_\beta$$
$$crossVA_{(+to-)} = V_\alpha \times I_\beta$$
$$crossVA_{(-to+)} = V_\beta \times I_\alpha$$
(8)

Figure 12A:
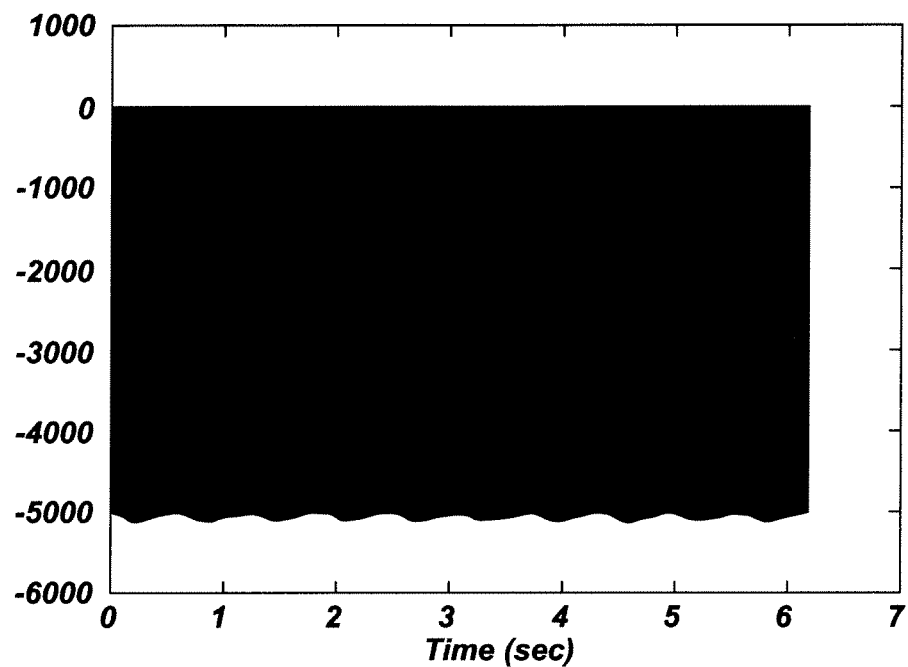
FIG. 12 show the cross VA signature (positive to negative) for 1 broken bar machine (FIG. 12A) and its frequency spectrum (FIG. 12B), according to aspects of the present invention.
Figure 12B:
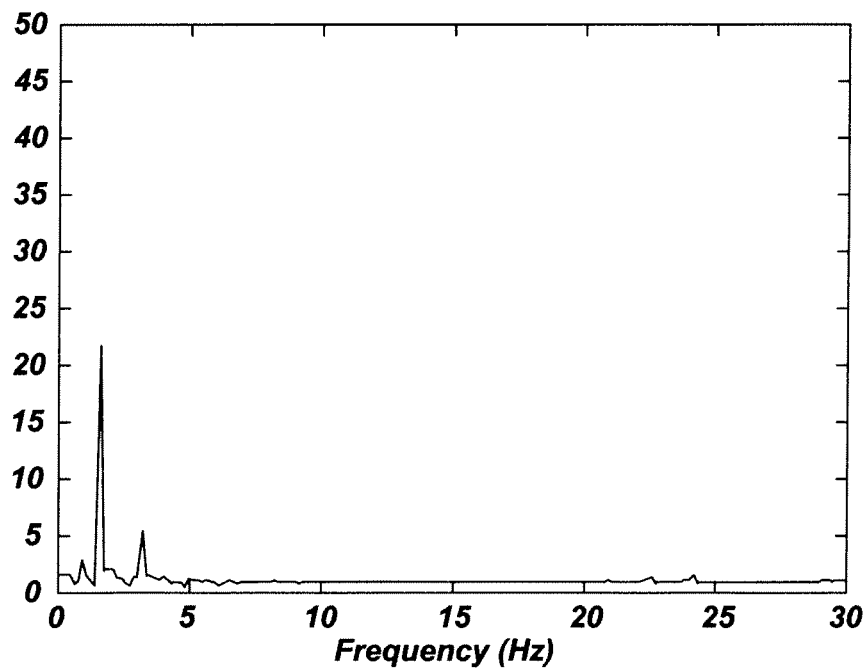
Figure 13A:
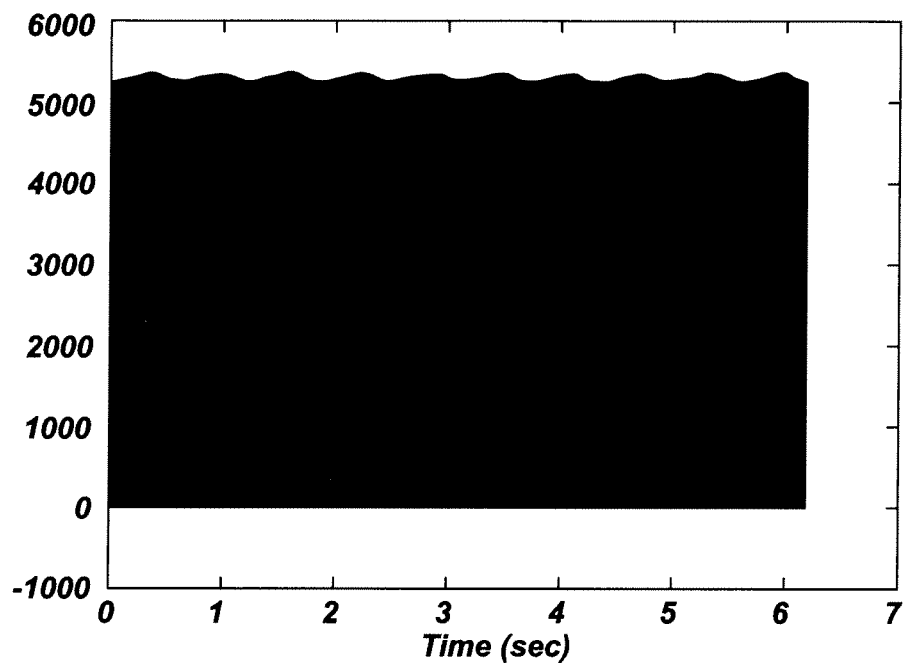
FIG. 13 show the cross VA signature (negative to positive) for 1 broken bar machine (FIG. 13A) and its frequency spectrum (FIG. 13B), according to aspects of the present invention.
Figure 13B:
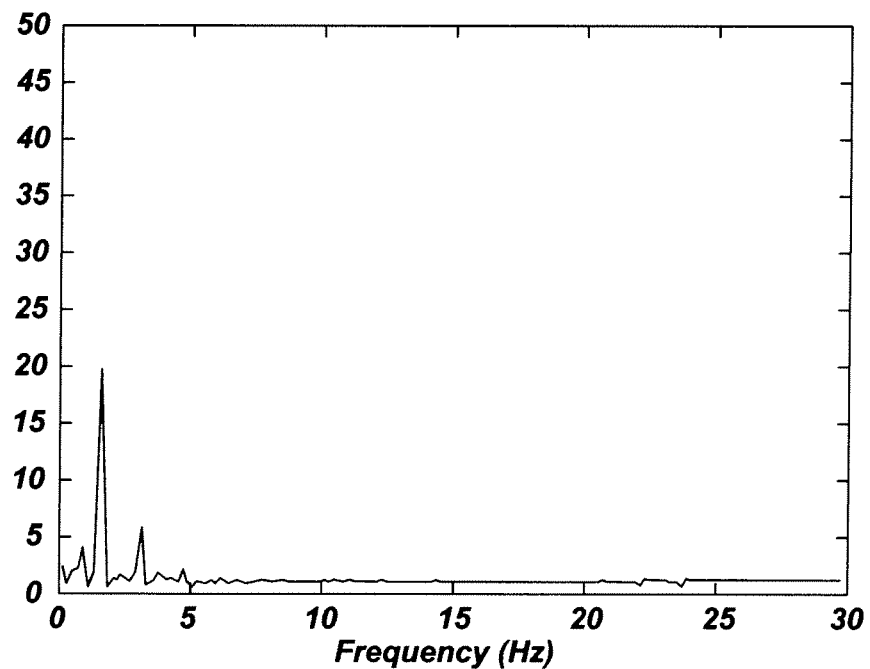

FIGS. 12 and 13 show the cross-VAs for 1 broken bar faulted machine as computed using equation (7) and (8) from the same machine data respectively. For better understanding of the low frequency component that is the signature for fault, frequency spectrum is also shown in the respective figures. Similar waveforms can be obtained for positive and negative VAs. Table 1 depicts a comparison of fault signature strengths.

TABLE 1

| Signal | Fault Signal Strength |
|---|---|
| Positive VA | Low (10) |
| Negative VA | Low (9) |
| Cross VA (positive to negative) | High (22) |
| Cross VA (negative to positive) | High (19) |

Comparing the signature strength for the four volt-amperes as shown in table 1, it is observed that cross VA retain the signature much better as compared to positive or negative VA. Thus, one can use these signatures for classifying broken bar fault case after proper signal processing.

Power Profile Method:

Another aspect of the present invention includes the power profile method. Instantaneous power can also be monitored in order to detect broken rotor bar faults. The instantaneous power can be computed as shown in equation (9).

$$P(t) = v_a i_a + v_b i_b + v_c i_c$$
(9)

Figure 14:
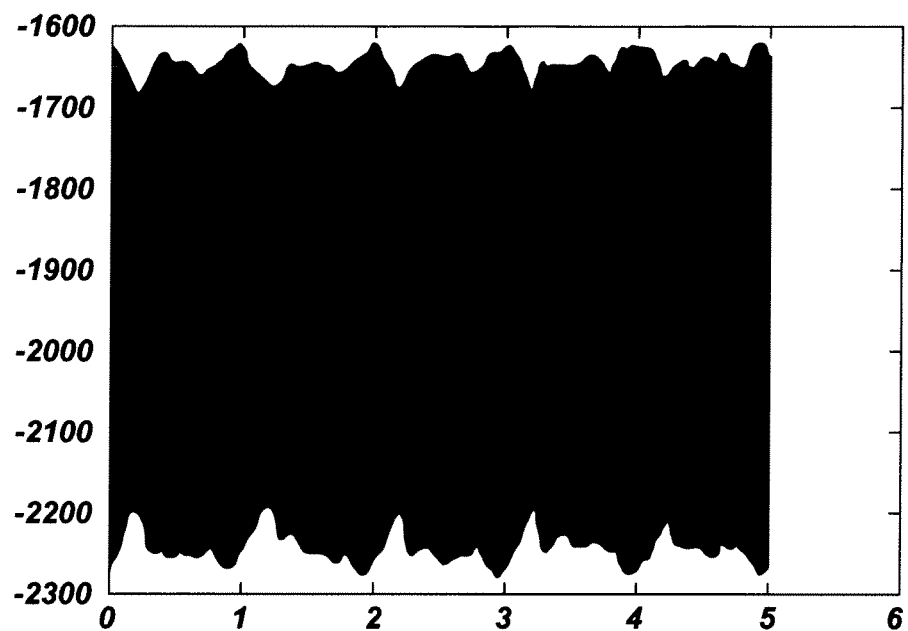
FIG. 14 shows instantaneous power for a healthy machine plotted with respect to time (seconds), according to aspects of the present invention.
Figure 15:
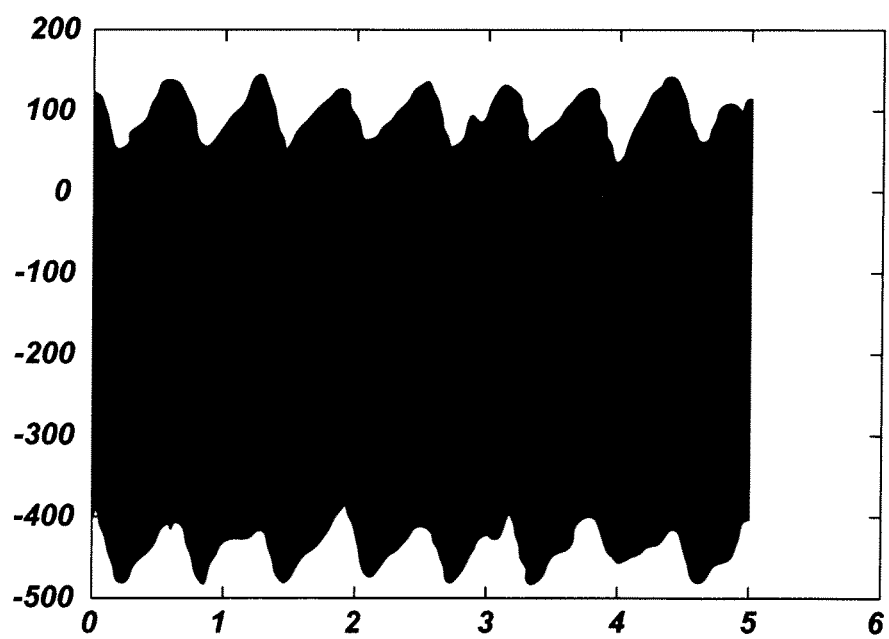
FIG. 15 shows instantaneous power for a 1 broken bar machine plotted with respect to time (seconds), according to aspects of the present invention.

It can be clearly observed from FIGS. 14 and 15 the effect of broken bar on profile of the instantaneous power is visible and this signature can be further utilized to declare a broken rotor bar fault.

All the signatures that is discussed in the prior section needs to be processed in order to declare a broken rotor bar fault. In the following section more of signal processing will be discussed.

Signal Processing:

In earlier section, several signatures were described that can be effectively used for detection of broken rotor bar. However these signatures need simplified signal processing so as to be implementable in relay platform. Careful observations of the earlier signatures reveals that these signatures have DC as well as high frequency unwanted signals that must be removed. Thus, effective signal processing involves removal of DC and high frequency signal from the above signals and thereby obtain the low frequency signature of the broken rotor bar.

Removal of dc:

A high pass filter can remove the DC component as explained below: Wash out: A wash out is typically a high pass filter given by the transfer function that can be designed using a time constant 'τ'.

$$H(s) = \frac{\tau s}{1 + \tau s}$$
(10)

By applying Tustin Transformation, $$H(z) = \frac{\frac{2\tau}{2\tau + T} - \frac{2\tau}{2\tau + T}z^{-1}}{1 - \frac{2\tau - T}{2\tau + T}z^{-1}}$$
(11)

Where T is the sampling time period.

Selection of time constant 'τ' is very critical as it is intended to remove the dc component and not the low frequency component which corresponds to broken rotor bar frequency.

Figure 16A:
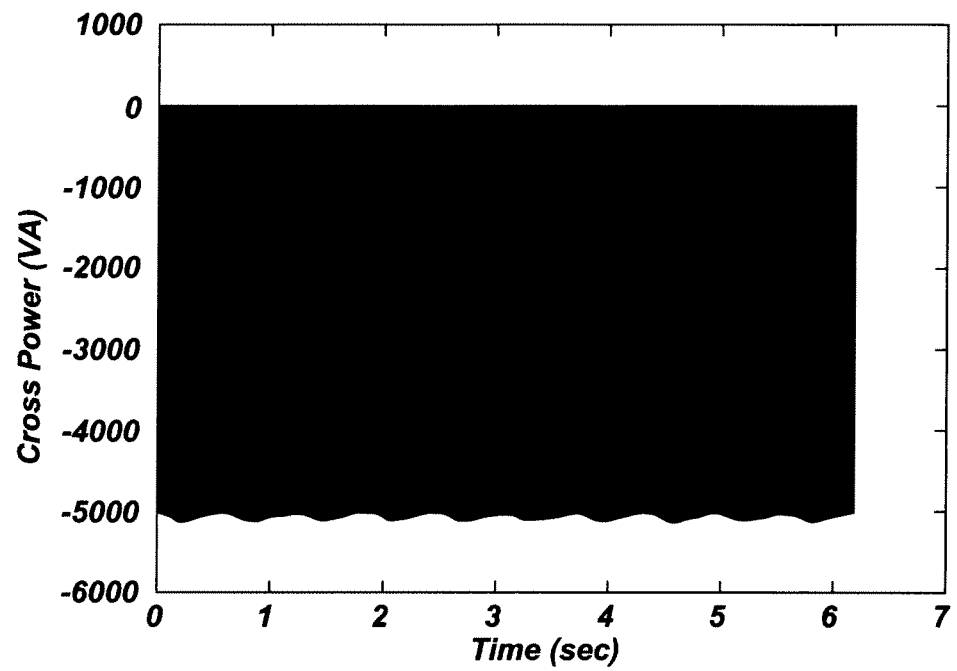
FIG. 16 shows the cross VA signature (positive to negative) for 1 broken bar machine with the dc component (FIG. 16A) and with dc component removed (FIG. 16B), according to aspects of the present invention.
Figure 16B:
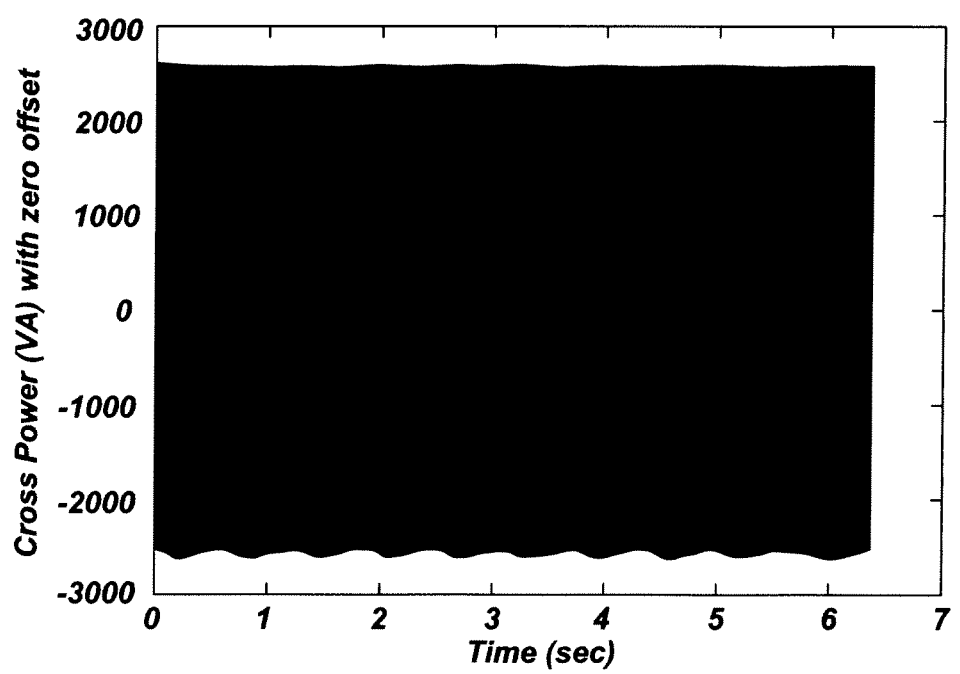

Typically filter cut of frequency can be set 0.5-0.7 Hz. The typical first order filter is shown in equation. FIG. 16 shows the cross VA signature (positive to negative) getting filtered through this filter to remove the DC component. The dc component can also be removed by subtracting the long term averaging value of the signature from itself.

$$y(T)=0.9993x(T)-0.9993x(T-1)+0.9986y(T-1) \quad (12)$$

Removal of High Frequency Signal:

High frequency can be removed using a rolling average filter. However the length of the rolling average is very critical to select so as to have maximum attenuation possible for the high frequency component at the same time to have minimum possible length to reduce computational burden. For a given number of samples per fundamental cycle (say $T_0$), following table (2) shows the effect of length of the rolling average filter on high frequency signature attenuation. Table 2 depicts effect of length of rolling average filter on high frequency component.

TABLE 2

| Length ($T_0$) | Effect on High Frequency |
|---|---|
| Less than $T_0/2$ | Magnitude is High |
| Equal to $T_0/2$ | Attenuated |
| Between $T_0/2$ and $T_0$ | Magnitude is High |
| Equal to $T_0$ | Attenuated similar when length is T0/2 |

Thus, optimal rolling average filter length is half the number of samples per fundamental cycle. Figure shows effect of rolling average filter length when there are 64 samples per fundamental cycle.

Figure 17A:
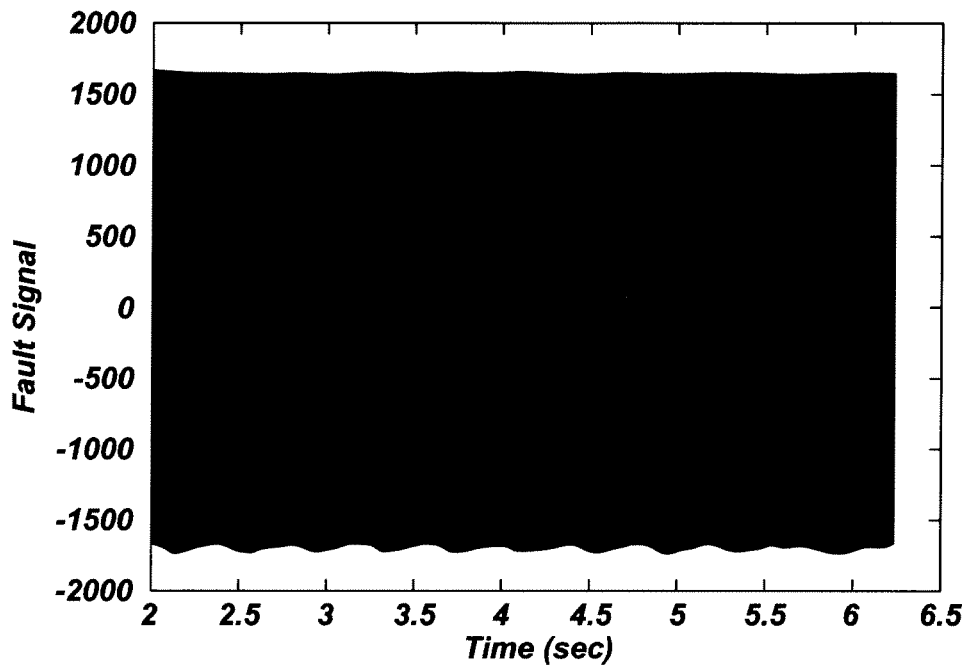
FIG. 17 shows the cross VA signature (positive to negative) for 1 broken bar machine with the high frequency component (FIG. 17A) and with high frequency component removed (FIG. 17B), according to aspects of the present invention.
Figure 17B:
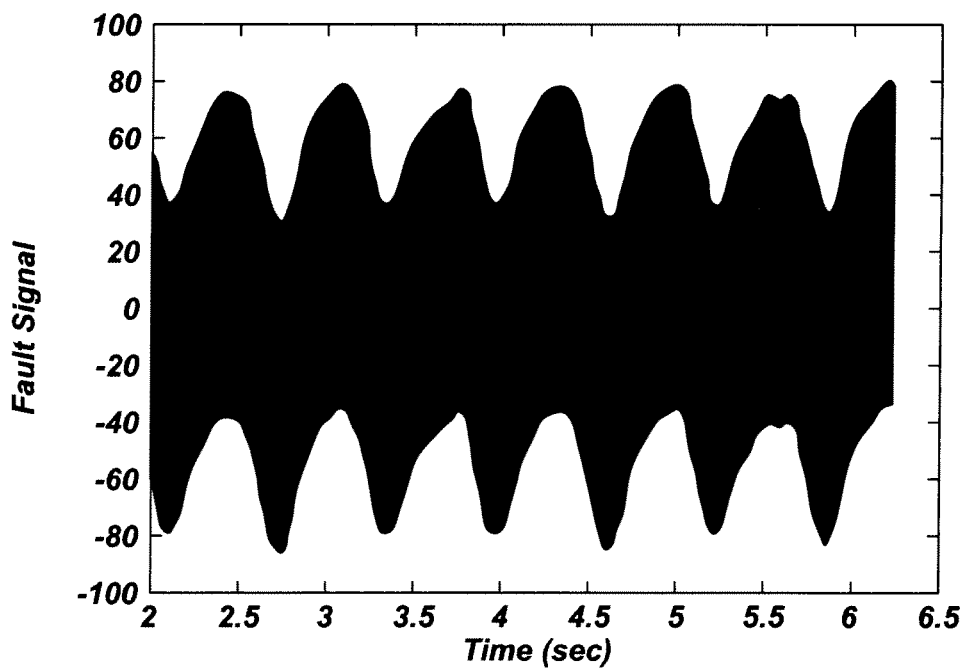
Figure 18A:
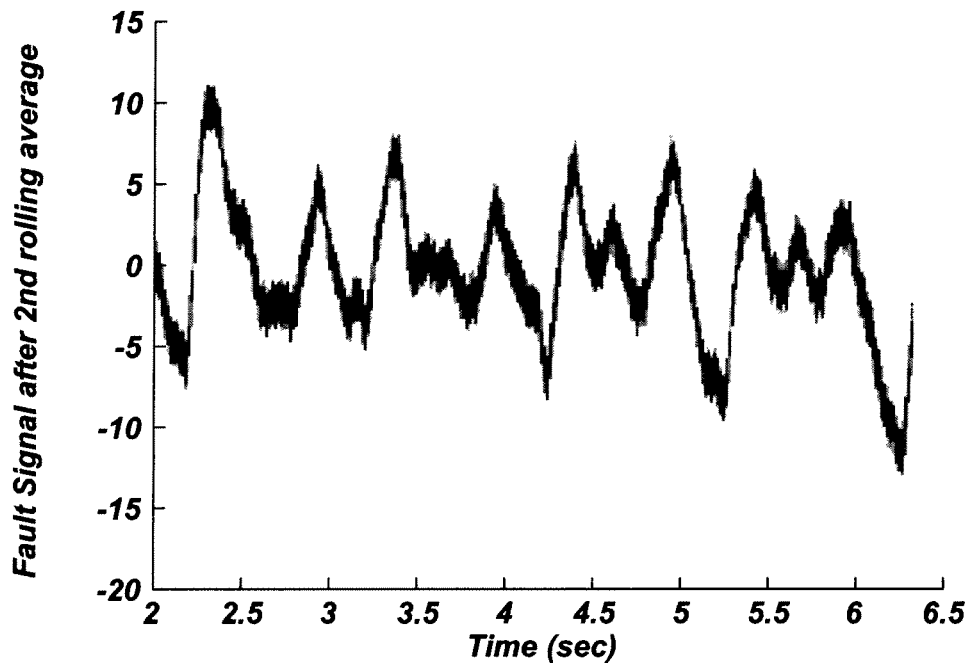
FIG. 18 shows the cross VA signature (positive to negative) after signal processing for a healthy machine (FIG. 18A) and for 1 broken bar machine (FIG. 18B), according to aspects of the present invention.
Figure 18B:
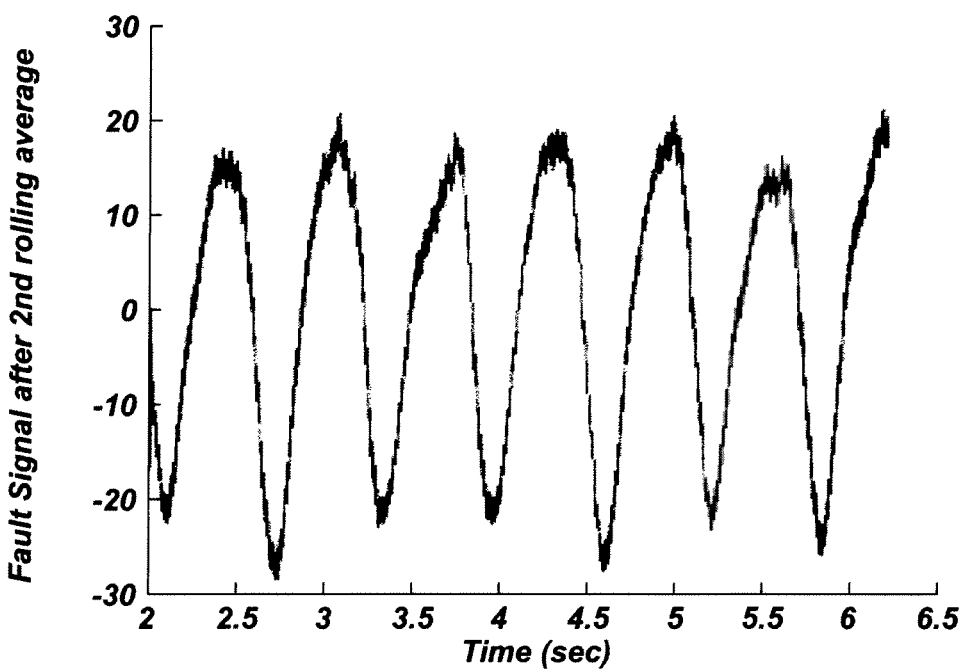

As observed in FIG. 17 the signature is still having significant high frequency component that can be removed by another level rolling average filter as shown in FIG. 18 of same filter length.

This signature can be utilized further for declaration of fault as will be explained in following section.

Figure 19:
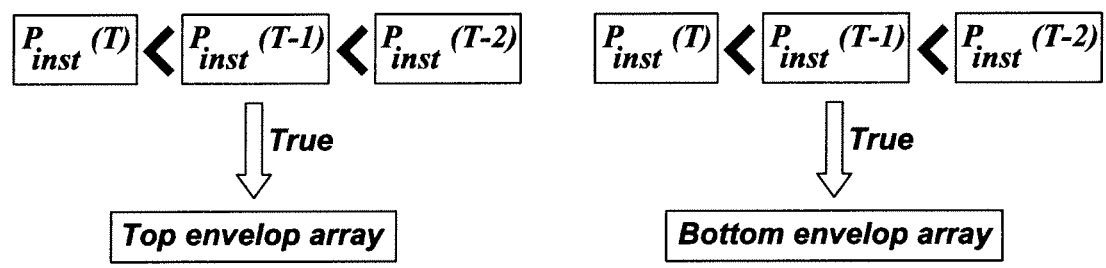
FIG. 19 shows a logical approach for detection of profile of the signature, according to aspects of the present invention.

Profile Detector:

Another simple-to-implement method can be used for getting the profile of the fault signature without using any filtering by using the peak detector, the logic being shown in FIG. 19 where $P_{inst}(T)$ refers to $T^{th}$ sample of the instantaneous signal whose peak profile has to be traced.

Figure 20A:
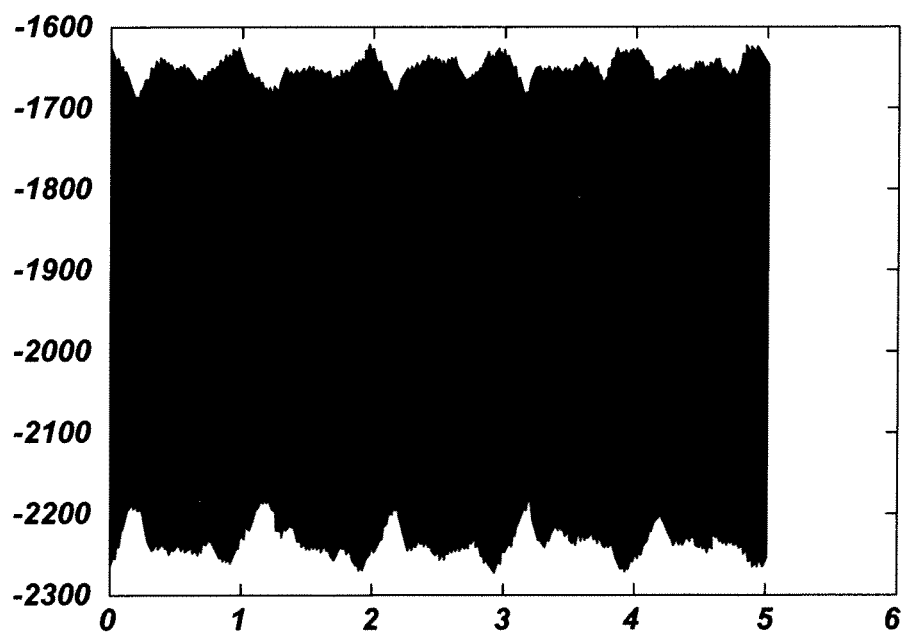
FIG. 20 shows the instantaneous VA signature for a healthy machine with respect to time (seconds) for original signal (FIG. 20A) and top and bottom envelop (FIG. 20B), according to aspects of the present invention.
Figure 20B:
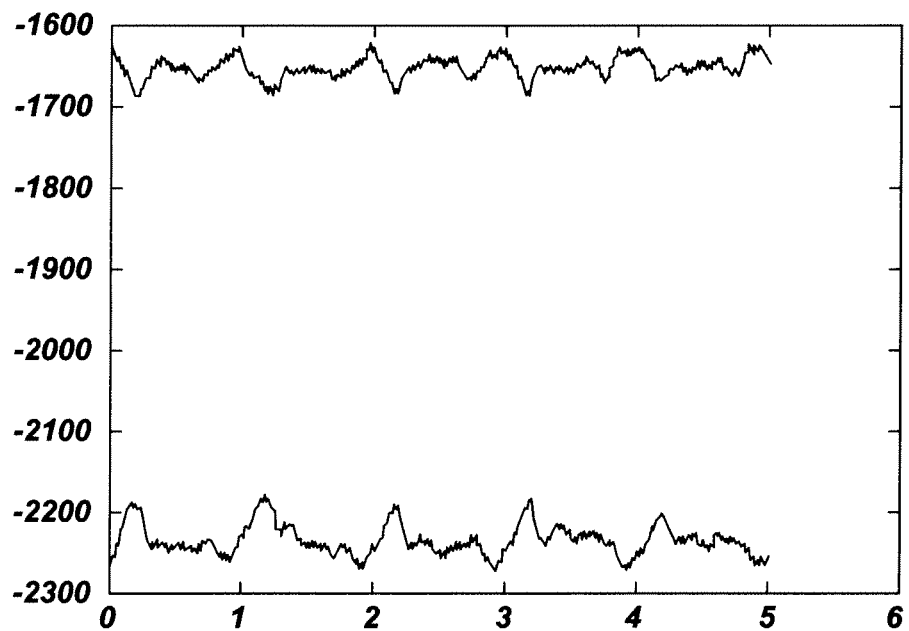
Figure 21A:
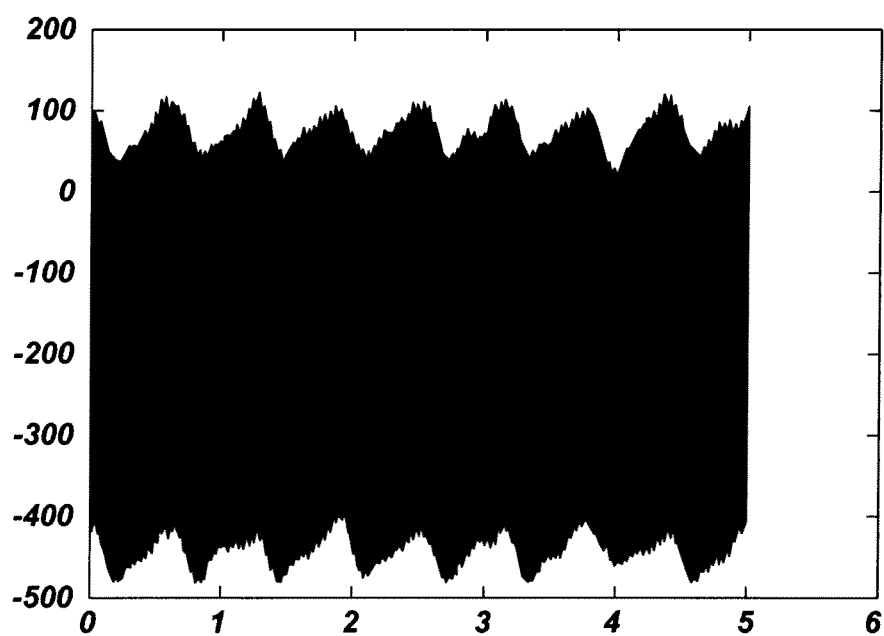
FIG. 21 shows the instantaneous VA signature for a 1 broken bar machine with respect to time (seconds) for original signal (FIG. 21A) and top and bottom envelop (FIG. 21B), according to aspects of the present invention.
Figure 21B:
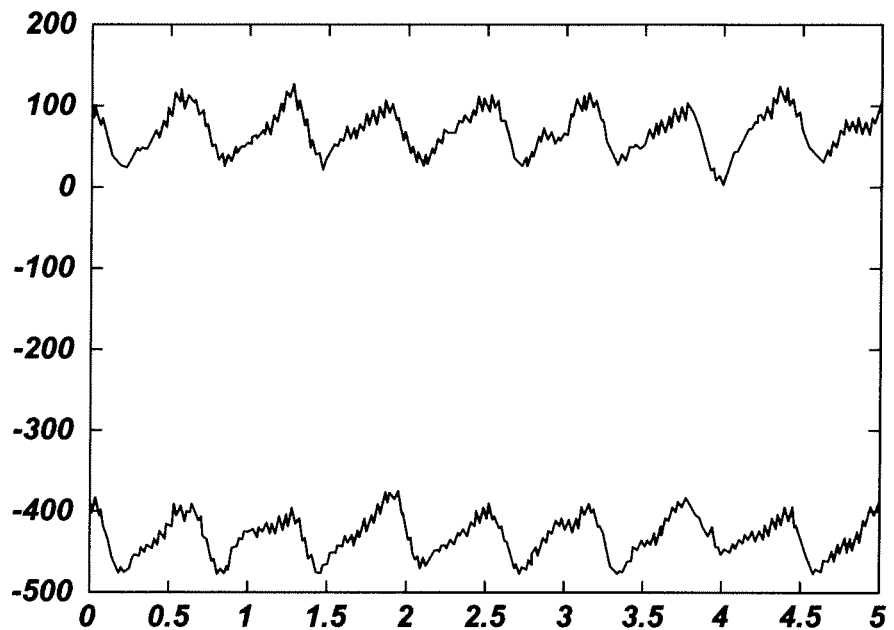

FIGS. 20 and 21 show the profile of the instantaneous power as traced out using the above algorithm.

Figure 22A:
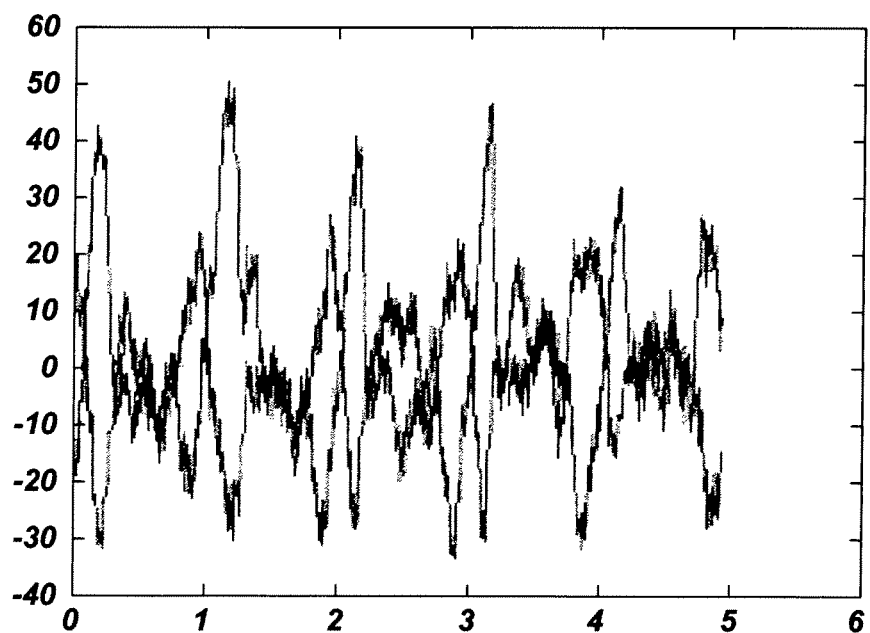
FIG. 22 shows the instantaneous VA signature envelope after removal of DC with respect to time (seconds) for a healthy machine (FIG. 22A) and for a 1 broken bar machine (FIG. 22B), according to aspects of the present invention.
Figure 22B:
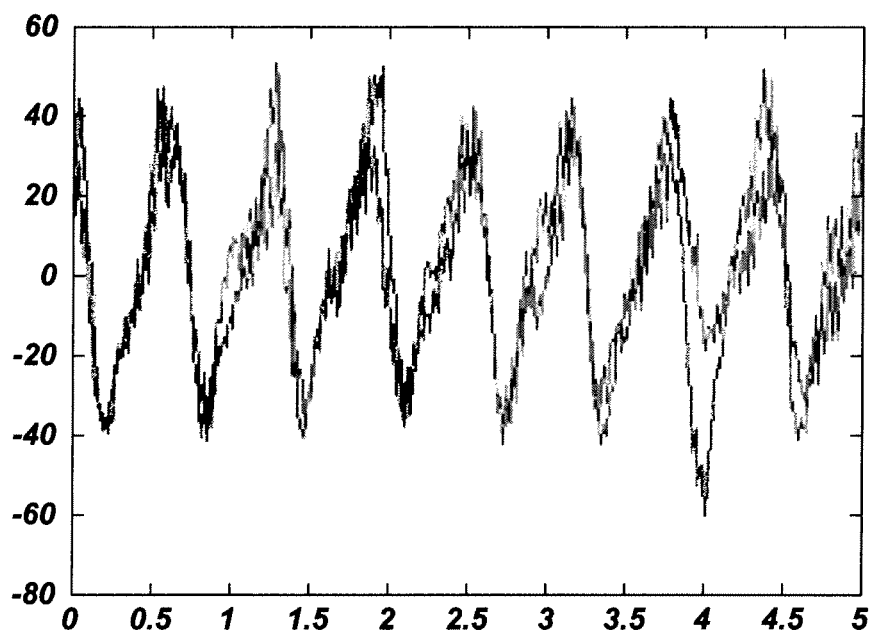

The DC from the above signals can be removed as explained earlier using a wash out or can be removed by using a 5 sec window. FIG. 22 shows the signature after removal of dc from the envelope. An interesting feature can be observed for the signature when the healthy and broken bar signatures are compared. For healthy machine, the top and bottom envelope is predominantly out of phase that signifies that the low frequency component is multiplicative harmonic while for the broken bar machine, the envelopes are in phase that signifies that the low frequency component is additive in nature. This property can be further utilized for detection of faults.

Figure 23A:
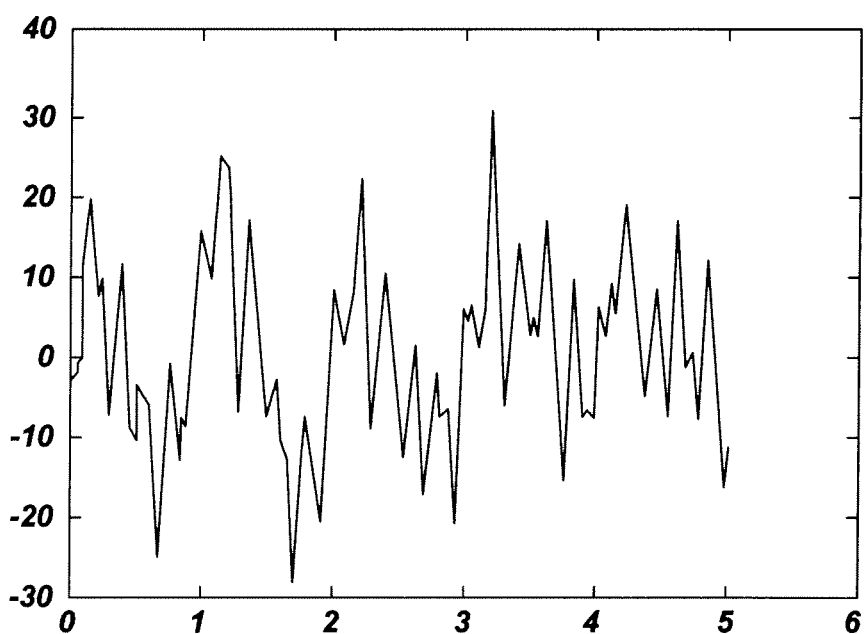
FIG. 23 shows the top and bottom envelope added together with respect to rime (seconds) for a healthy machine (FIG. 23A) and for a 1 broken bar machine (FIG. 23B), according to aspects of the present invention.
Figure 23B:
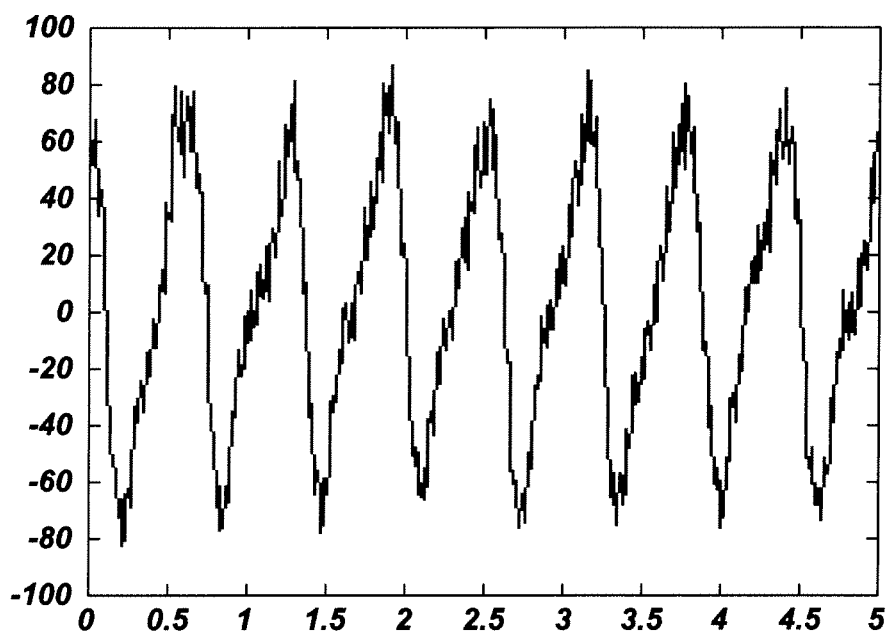

Adding the two envelope signals clearly indicates the difference in the signature and can be utilized for declaration of fault as shown in FIG. 23.

Figure 24A:
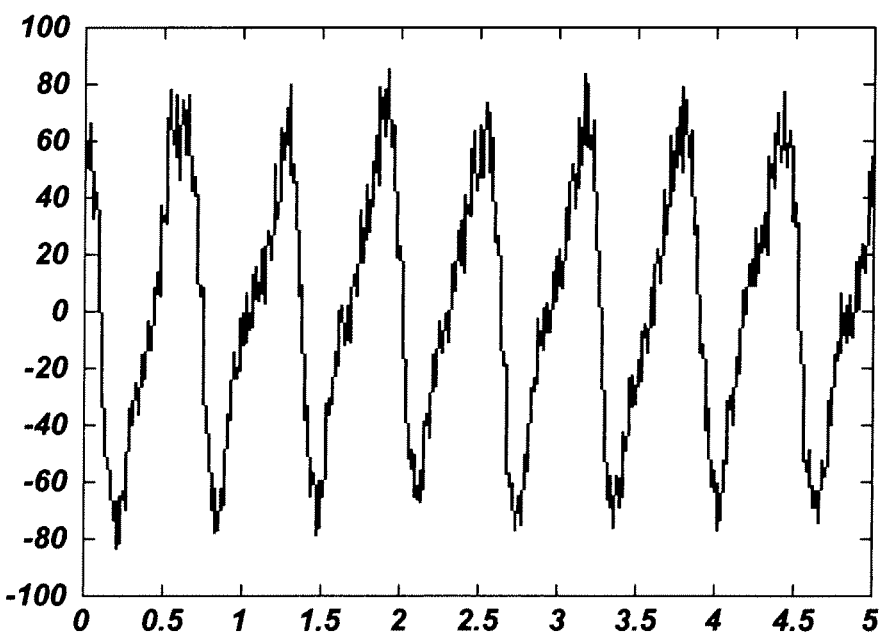
FIG. 24 shows for 1 broken bar machine the top and bottom envelope added together with respect to time (seconds) (FIG. 24A) and absolute magnitude of the added signal (FIG. 24B), according to aspects of the present invention.
Figure 24B:
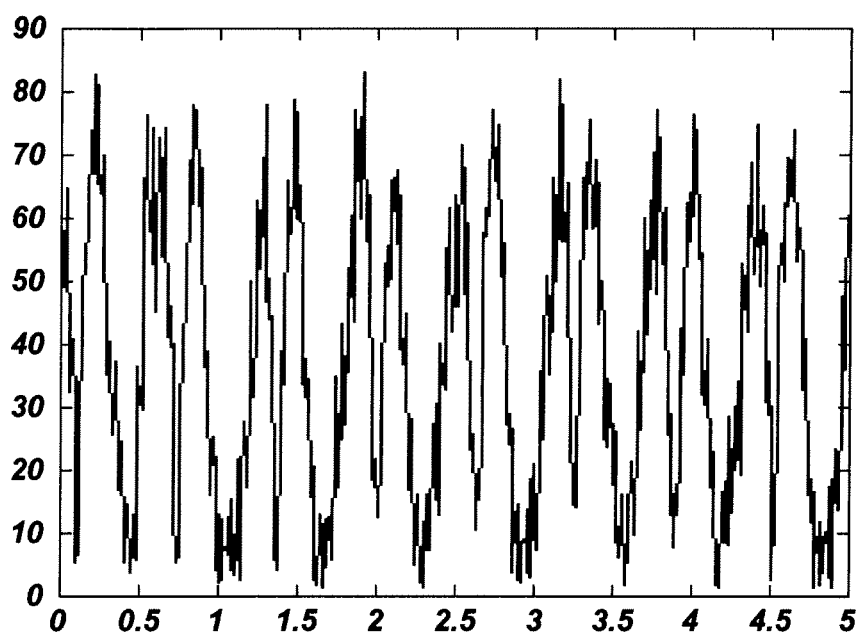

Declaration of Faults:

The last step involves declaration of fault from the above processed signals. In order to implement, there typically two ways this can be done, By R. M. S. Computation:

R.M.S can be computed of the above signatures directly. Table (3) shows the rms value of the fault signature as shown in FIG. 24 for the top envelope. This also shows the repeatability of the magnitude of the rms for faulty machine. Table 3 depicts a comparison of fault signature strength using rms method.

TABLE 3

| Time (sec) | Healthy | 1 Broken Bar | 3 Broken Bar |
|---|---|---|---|
| 0 to 5 | 121.30 | 233.28 | 388.33 |
| 6 to 10 | 147.52 | 237.50 | 279.04 |
| 11 to 15 | 158.59 | 229.57 | 369.24 |
| 16 to 20 | 139.57 | 229.58 | 347.25 |
| 21 to 25 | 156.01 | 230.12 | 377.88 |
| 26 to 30 | 152.02 | 243.50 | 371.39 |
| 31 to 35 | 187.26 | 230.67 | 389.62 |

By Average Computation:

Another aspect of the present invention includes a method for fault declaration involves taking the average of its absolute magnitude for the signature. FIG. 30 shows the absolute signal for the top and bottom envelope added together. The average of this when taken shows a significant change from healthy to broken bar machine.

Table (4) shows the comparison of the average magnitude for healthy, 1 broken bar and 3 broken bar cases that clearly demarcates the three and can be effectively utilized for declaration of fault. Table 4 provides a comparison of fault signature strength with average method

TABLE 4

| Time (sec) | Healthy | 1 Broken Bar | 3 Broken Bar |
|---|---|---|---|
| 0 to 5 | 8.63 | 37.64 | 67.73 |
| 6 to 10 | 6.70 | 37.55 | 66.25 |
| 11 to 15 | 13.11 | 37.41 | 67.4 |
| 16 to 20 | 7.98 | 35.90 | 64.75 |
| 21 to 25 | 13.27 | 36.8 | 67.85 |
| 26 to 30 | 8.95 | 37.36 | 66.8 |
| 31 to 35 | 8.25 | 35.85 | 67.71 |

One way to reduce the complexity of the method under aspects of the present invention and reduction in number of data points to be used one can also resort to down sampling. This can be implemented in several ways one of which can be selecting every $5^{th}$ data point of the signal. For example, in case of profile detection, peak of the signal occurs every 10 ms i.e., data arrives at 100 Hz for 50 Hz supply. If the data is down sampled such that every $5^{th}$ data point of the signal is kept in memory for further processing, the data length will reduce by $\frac{1}{5}^{th}$ and it will be sampled at 20 Hz. So every signal less than 10 Hz will still be present in the data length. This way one can further reduce the data storage requirement for computation.

Figure 25:
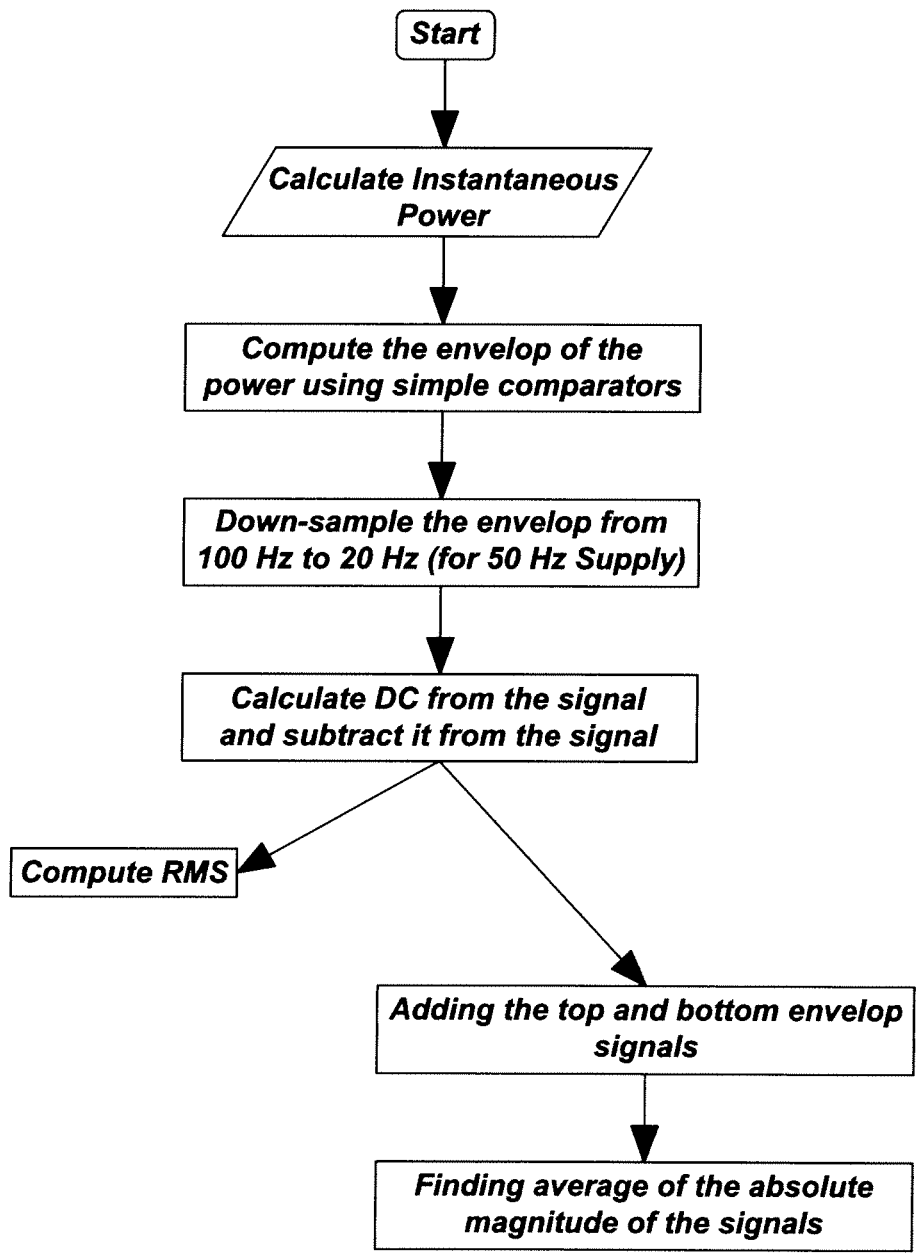
FIG. 25 shows a flowchart for broken rotor bar detection using instantaneous power profile and/or volt ampere method, according to aspects of the present invention.
Figure 26:
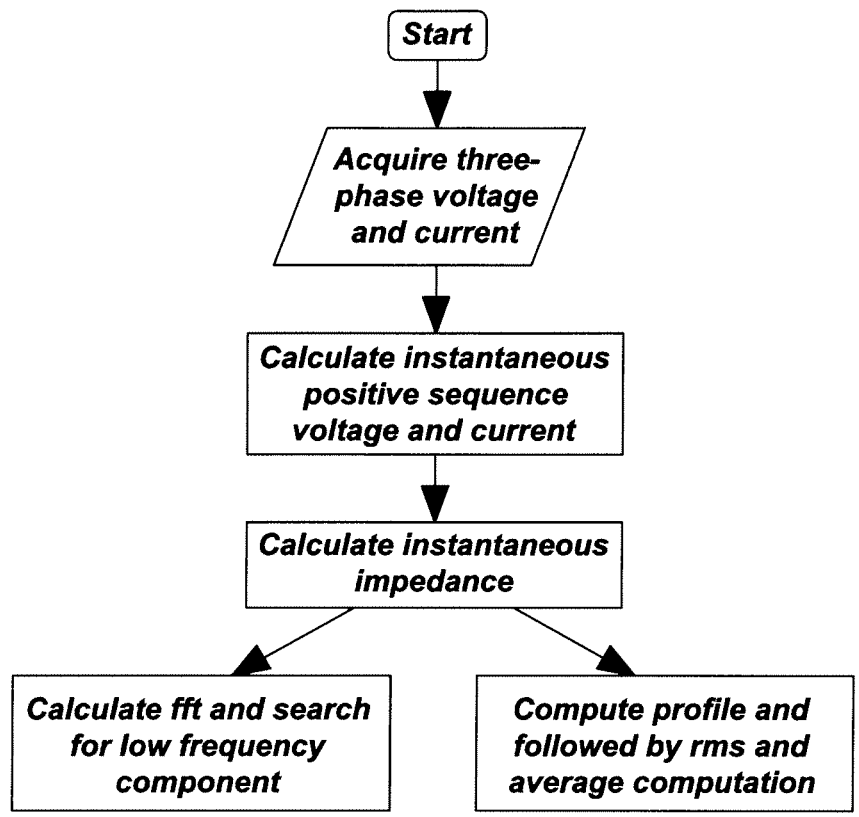
FIG. 26 shows a flowchart for broken rotor bar detection using instantaneous impedance method, according to aspects of the present invention.
Figure 27:
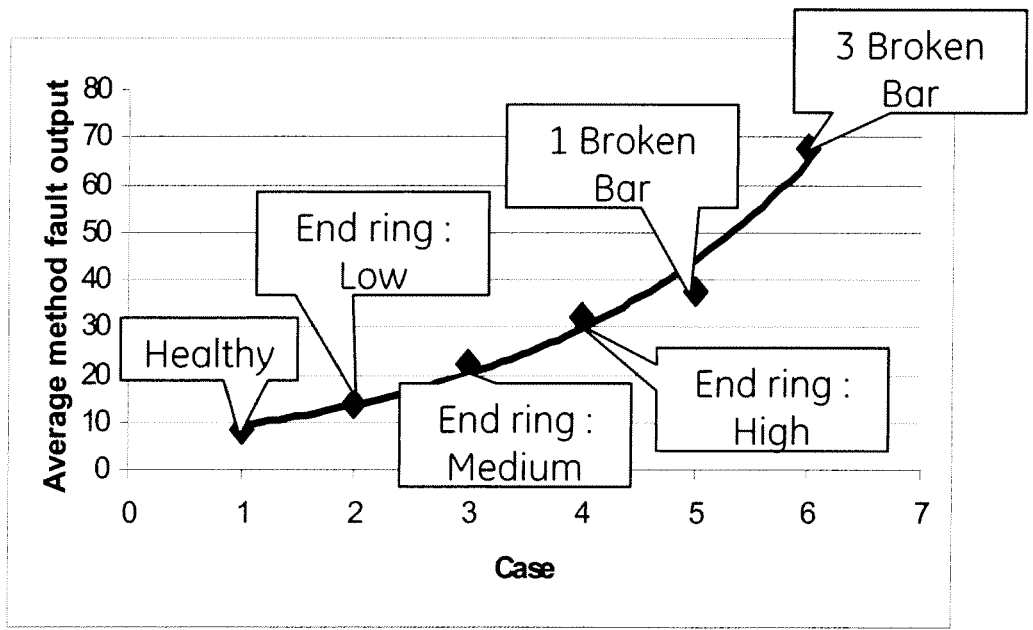
FIG. 27 shows a comparison of fault signature based on average value of instantaneous power profile for different failure cases of the broken bar, according to aspects of the present invention.

Therefore, aspects of the present invention for detecting broken rotor bar may involve three steps namely, amplification of the signature, processing the signature and thereby coming to a unique number which can confidently alarm and notify the user about broken rotor bar. Based on the above study, the following flowcharts shown in FIGS. 25 and 26 can be utilized for detection of the fault. However, any of the above methods at any stage or a combination of thereof can be used for predicting the broken bar fault.

Therefore, according to one embodiment of the present invention, a method of detecting an anomaly in a rotor of an induction machine comprises obtaining/receiving a signal from the induction machine; processing the signal thereby obtaining a low frequency signal; rectifying the low frequency signal; and, declaring if the anomaly is present, based on the rectified low frequency signal.

According to another embodiment of the present invention, a system for determining an anomaly in a rotor of a machine, comprises a device module to the machine an configured to measure characteristics of the machine, the device comprising a memory, wherein the memory comprises instructions for: obtaining/receiving a signal from the induction machine; processing the signal thereby obtaining a low frequency signal; rectifying the low frequency signal; and, declaring if the anomaly is present, based on the rectified low frequency signal.

According to another embodiment of the present invention, a method of detecting an anomaly in an induction machine, comprises calculate one of instantaneous power, positive, negative, and cross-coupled volt-ampere of the induction machine; compute an envelope of the one of instantaneous power, positive, negative, and cross-coupled volt-ampere; down-sample the envelope; calculate direct current from a signal; subtract the direct current from the signal; one of: compute a root mean square; add a top and bottom envelope signal and finding an average of an absolute magnitude of the signals; and, conduct a fft of the signal.

According to another embodiment of the present invention, a method of detecting an anomaly in an induction machine, comprises acquiring a three-phase voltage and current from the induction machine; calculating instantaneous positive sequence voltage and current; calculating instantaneous impedance; one of: calculate fft and search for low frequency component; and compute profile and compute root mean square and average computation.

According to another embodiment of the present invention, a method of detecting an anomaly in an induction machine comprises detecting at least one signal originated from the induction machine, wherein the signal signifies an anomaly; processing the signal comprising one of: removing of dc and high frequency signals from the signal; and using a peak detector to get a profile of a fault signature; and, declaring of fault of the signal.

The present invention has been described in terms of the preferred embodiment, and it is recognized that equivalents, alternatives, and modifications, aside from those expressly stated, are possible and within the scope of the appending claims.

What is claimed is:

1. A method of detecting an anomaly in a rotor of an induction machine comprising:
   obtaining or receiving a signal representative of at least one of the instantaneous impedance, and an instantaneous cross volt-ampere from the induction machine;
   processing the signal thereby obtaining a low frequency signal,
   rectifying the low frequency signal; and
   declaring if the anomaly is present, based on the rectified low frequency signal, wherein the obtaining, receiving, processing, rectifying and declaring are performed via a processor-based device.

2. The method of claim 1, the rectifying comprises at least one of:
   computing a root mean square (RMS) of the low frequency signal; and
   computing an average of an absolute value of the low frequency signal.

3. The method of claim 2, the declaring comprises:
   comparing the computed RMS or computed average to a predetermined value of a healthy induction machine; and
   providing an alarm if the comparing indicates a presence of an anomaly.

4. The method of claim 1, the processing comprising:
   removing a dc component signal from the signal; and
   removing a high frequency signal from the signal.

5. The method of claim 4, the removing the high frequency signal comprises removing the high frequency signal a plurality of iterations.

6. The method of claim 1, the processing comprising processing the signal to be implementable in a computational platform.

7. The method of claim 1, the obtaining comprising one of:
   determining the instantaneous impedance based on a plurality of symmetrical components obtained from a measured phasor current and a phasor voltage of the induction machine; and
   determining the instantaneous volt-ampere based on a plurality of alpha and beta components obtained from the measured phasor current and the phasor voltage.

8. A system for determining an anomaly in a rotor of a machine, comprising:
   a device module to the machine and configured to measure characteristics of the machine, the device comprising a memory, wherein the memory comprises instructions for:
      obtaining or receiving a signal representative of at least one of an instantaneous impedance, and an instantaneous cross volt-ampere from the induction machine;
      processing the signal thereby obtaining a low frequency signal,
      rectifying the low frequency signal; and
      declaring if the anomaly is present, based on the rectified low frequency signal.

9. A method of detecting an anomaly in an induction machine comprising:
   detecting a signal representative of at least one of an instantaneous impedance, and an instantaneous cross volt-ampere originated from the induction machine, wherein the signal signifies an anomaly;
   processing the signal comprising one of:
      removing of dc and high frequency signals from the signal using a filter; and
      tracing an instantaneous power of the signal using a peak detector to get a profile of a fault signature; and
   declaring of fault of the signal, wherein the detecting, processing and declaring are performed via a processor-based device.

* * * * *

UNITED STATES PATENT AND TRADEMARK OFFICE
CERTIFICATE OF CORRECTION

| | | |
|---|---|---|
| PATENT NO. | : 8,473,228 B2 | Page 1 of 1 |
| APPLICATION NO. | : 12/637027 | |
| DATED | : June 25, 2013 | |
| INVENTOR(S) | : Tiwari et al. | |

It is certified that error appears in the above-identified patent and that said Letters Patent is hereby corrected as shown below:

On the Title Page, in the Figure, delete Tag "38" and insert Tag -- 28 --, therefor.

On Title Page 2, Item (56), under "OTHER PUBLICATIONS", in Column 2, Line 12, delete "Industr" and insert -- Industry --, therefor.

In the Drawing

In Fig. 2, Sheet 1 of 21, delete Tag "38" and insert Tag -- 28 --, therefor.

In the Specification

In Column 1, Line 18, delete "machines" and insert -- machines. --, therefor.

In Column 10, Line 31, delete "method" and insert -- method. --, therefor.

In the Claims

In Column 11, Line 51, in Claim 1, delete "of the" and insert -- of an --, therefor.

In Column 11, Line 18, in Claim 5, delete "signal a" and insert -- signal using a --, therefor.

Signed and Sealed this
Thirteenth Day of August, 2013

Teresa Stanek Rea
*Acting Director of the United States Patent and Trademark Office*